(12) United States Patent
Lee et al.

(10) Patent No.: US 12,745,575 B2
(45) Date of Patent: Sep. 22, 2026

(54) SEMICONDUCTOR LAYER, METHOD FOR MANUFACTURING SAME, AND TRANSISTOR COMPRISING SAME

(71) Applicant: HANSOL CHEMICAL CO., LTD., Seoul (KR)

(72) Inventors: Hyun-Kyung Lee, Jeollabuk-do (KR); Jang-Hyeon Seok, Sejong-si (KR); Jung-Woo Park, Seoul (KR); Jin-Seong Park, Gyeonggi-do (KR); Tae Hyun Hong, Seoul (KR); Jiazhen Sheng, Seoul (KR); Minjung Kim, Seoul (KR)

(73) Assignee: HANSOL CHEMICAL CO., LTD, Seoul (KR)

( * ) Notice: Subject to any disclaimer, the term of this patent is extended or adjusted under 35 U.S.C. 154(b) by 962 days.

(21) Appl. No.: 17/918,429

(22) PCT Filed: Apr. 14, 2021

(86) PCT No.: PCT/KR2021/004685

§ 371 (c)(1),
(2) Date: Oct. 12, 2022

(87) PCT Pub. No.: WO2021/210907

PCT Pub. Date: Oct. 21, 2021

(65) Prior Publication Data

US 2023/0146033 A1 May 11, 2023

(30) Foreign Application Priority Data

Apr. 16, 2020 (KR) ........................ 10-2020-0045913

(51) Int. Cl.

| | |
|---|---|
| ***H10P 14/24*** | (2026.01) |
| ***H10D 30/67*** | (2025.01) |
| ***H10P 14/20*** | (2026.01) |

(52) U.S. Cl.

CPC ......... *H10P 14/24* (2026.01); *H10D 30/6755* (2025.01); *H10P 14/3434* (2026.01); *H10P 14/38* (2026.01)

(58) Field of Classification Search

CPC ............... H10D 30/6755; H10D 99/00; H10D 30/0314; H10D 30/0321; H10D 30/6757;
(Continued)

(56) References Cited

U.S. PATENT DOCUMENTS

2013/0122192 A1 5/2013 Bluhm et al.

FOREIGN PATENT DOCUMENTS

CN 102768945 A 11/2012
JP 2010-153802 A 7/2010
(Continued)

OTHER PUBLICATIONS

Jeong et al Translation and Original Document (Year: 2020).*
(Continued)

*Primary Examiner* — Jessica S Manno
*Assistant Examiner* — Victor Joseph Lasasso
(74) *Attorney, Agent, or Firm* — Brooks, Cameron & Huebsch, PLLC

(57) ABSTRACT

A method for manufacturing a semiconductor layer is provided. The method for manufacturing a semiconductor layer may include preparing a substrate, and conducting a first unit process of reacting a first precursor including indium (In) and a first reaction source and a second unit process of reacting a second precursor including gallium (Ga) and a second reaction source to form a semiconductor layer including the indium and the gallium on the substrate.

11 Claims, 28 Drawing Sheets

(58) Field of Classification Search
CPC ................. H10D 86/60; H10D 84/038; H10D 30/6735; H10D 62/121; H01L 21/0228; H01L 21/02554; H01L 21/02557; H01L 21/02488; H01L 21/02422; H01L 21/02263; H01L 21/02172; H01L 21/02109; H01L 21/02205
See application file for complete search history.

(56) References Cited

FOREIGN PATENT DOCUMENTS

| | | | | | |
|---|---|---|---|---|---|
| JP | 2016-511936 | A | | 7/2014 | |
| JP | 2020-009960 | A | | 1/2020 | |
| KR | 10-2017-0042422 | | | 4/2017 | |
| KR | 10-2018-0101754 | A | | 9/2018 | |
| KR | 10-2019-0014847 | A | | 2/2019 | |
| KR | 20190014847 | A | * | 2/2019 | .......... H10P 14/3434 |
| KR | 10-2019-0121468 | A | | 10/2019 | |
| KR | 10-2020-0000664 | A | | 1/2020 | |
| KR | 10-2020-0008512 | A | | 1/2020 | |
| KR | 20200008512 | A | * | 1/2020 | ........ H01L 27/11529 |
| KR | 10-2020-0101150 | A | | 8/2020 | |
| WO | 2017/150115 | A1 | | 9/2017 | |

OTHER PUBLICATIONS

Park et al Translation and Original Document (Year: 2019).*

International Search Report and Written Opinion from related PCT Application No. PCT/KR2021/004685, dated Apr. 14, 2021, 12 pages.

Jiazhen Sheng, et al., Atomic Layer Deposition of Indium Gallium Oxide Thin Film for Thin Film Transistor Applications, Article, dated Jun. 23, 2017, 27 pages.

* cited by examiner

| | IGO(6:1) | IGO(4:1) | IGO(3:1) |
|---|---|---|---|
| $V_{th}$ [V] | -6.2±0.4 | -2.5±0.6 | 1.57±0.2 |
| $\mu_{sat}$ [$cm^2$/Vs] | 14.4±0.5 | 17.7±0.5 | 14.6±0.3 |
| S.S. [V/decade] | 1.0±0.06 | 0.42±0.04 | 0.38±0.02 |
| $I_{ON}/I_{OFF}$ | $4 \times 10^{10}$ | $1.8 \times 10^{11}$ | $2.4 \times 10^{11}$ |

SEMICONDUCTOR LAYER, METHOD FOR MANUFACTURING SAME, AND TRANSISTOR COMPRISING SAME

TECHNICAL FIELD

The present disclosure relates to a semiconductor layer and a method for manufacturing the same, and a transistor including the same, and in particular, to a semiconductor layer formed by providing a precursor including indium and a reaction source on a substrate and a method for manufacturing the same, and a transistor including the same.

BACKGROUND ART

In the current display market, particularly in the LCD field, a-Si-based transistors are mainly used. However, in response to recent market demands asking for high resolution and OLED applications, oxide semiconductor-based transistors are being studied.

For example, Korean Patent Application Laid-Open No. 10-2019-0067556 (Application No.: 10-2017-016714, Applicant: Industry-University Cooperation Foundation, Yonsei University) discloses an oxide semiconductor thin film transistor and a method for manufacturing the same, the method including forming a gate electrode on a substrate, forming a gate insulating film on the gate electrode, forming a semiconductor thin film on the gate insulating film, and forming source/drain electrodes spaced apart from each other on the semiconductor thin film, wherein, in the forming of a semiconductor thin film, the semiconductor thin film is formed using a co-sputtering method using an oxide semiconductor target and a polymer target to improve hydrophobicity of the semiconductor thin film.

However, an oxide thin film semiconductor layer using an existing sputtering system has a disadvantage in that it is difficult to control reliability and mobility. In addition, high mobility materials generally have a disadvantage of poor reliability, and materials having favorable reliability on the contrary have a disadvantage of low mobility. In addition, there are disadvantages in that it is difficult to precisely control thicknesses and it is difficult to control properties through adjusting compositions. In addition thereto, there is a disadvantage in that it is difficult to use in a low-temperature process since high-temperature heat treatment is inevitably required mostly even in processes after depositing a thin film. Accordingly, various technologies relating to formation of an oxide semiconductor thin film capable of resolving the above-described problems have been researched and developed.

PRIOR ART DOCUMENTS

Patent Documents (Patent Document 1) Korean Patent Application Laid-Open No. 10-2019-0067556.

DISCLOSURE

Technical Problem

An object of the present disclosure is to provide a semiconductor layer having enhanced mobility and a method for manufacturing the same, and a transistor including the same.

Another object of the present disclosure is to provide a semiconductor layer having an enhanced on/off ratio ($I_{ON}/I_{OFF}$) and a method for manufacturing the same, and a transistor including the same.

Still another object of the present disclosure is to provide a semiconductor layer in which the composition is readily controlled and a method for manufacturing the same, and a transistor including the same.

Yet another object of the present disclosure is to provide a semiconductor layer with enhanced reliability and a method for manufacturing the same, and a transistor including the same.

The object of the present disclosure is not limited to the object described above.

Technical Solution

In view of the above, one embodiment of the present disclosure provides a method for manufacturing a semiconductor layer.

According to one embodiment, the method for manufacturing a semiconductor layer may include preparing a substrate, and conducting a first unit process of reacting a first precursor including indium (In) and a first reaction source and a second unit process of reacting a second precursor including gallium (Ga) and a second reaction source to form a semiconductor layer including the indium and the gallium on the substrate, wherein the first precursor and the second precursor have a ligand with the same chemical structure.

According to one embodiment, the first precursor may include a compound represented by the following Chemical Formula 1, and the second precursor may include a compound represented by the following Chemical Formula 2.

[Chemical Formula 1]

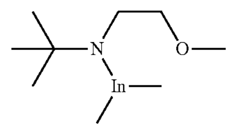

[Chemical Formula 2]

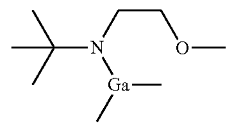

According to one embodiment, the method further includes, after the forming of a semiconductor layer, heat treating the semiconductor layer, wherein a temperature of the heat treating of the semiconductor layer is controlled depending on the number of repetitions of the first unit process and the number of repetitions of the second unit process.

According to one embodiment, when the number of repetitions of the first unit process:the number of repetitions of the second unit process is 4:1, the semiconductor layer may be heat treated at a temperature of higher than 350° C. and lower than 450° C.

According to one embodiment, when the number of repetitions of the first unit process:the number of repetitions of the second unit process is 6:1, the semiconductor layer may be heat treated at a temperature of higher than 300° C. and lower than 400° C.

According to one embodiment, the semiconductor layer may be heat treated by ultraviolet (UV) rays.

According to one embodiment, the first reaction source and the second reaction source may include a plasma in which oxygen ($O_2$) and argon (Ar) are mixed.

According to another embodiment, the method for preparing a semiconductor layer includes preparing a substrate, providing a precursor including indium on the substrate, providing a reaction source on the precursor-provided substrate to form a semiconductor layer, in which the precursor and the reaction source are reacted, at a first temperature, and heat treating the semiconductor layer at a second temperature, wherein the temperature of the heat treatment of the semiconductor layer is controlled depending on the type of the reaction source.

According to another embodiment, the reaction source includes a plasma in which oxygen ($O_2$) and argon (Ar) are mixed, and the first temperature is controlled to higher than 100° C. and lower than 250° C.

According to another embodiment, the reaction source includes water ($H_2O$), and the first temperature is controlled to higher than 100° C. and lower than 200° C.

According to another embodiment, the precursor may include a compound represented by the following Chemical Formula 1.

[Chemical Formula 1]

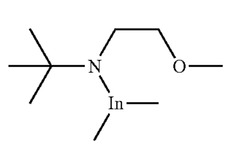

In view of the above, one embodiment of the present disclosure provides a transistor.

According to one embodiment, the transistor includes a substrate, a gate insulating film disposed on the substrate, an active layer disposed on the gate insulating film and including indium (In) and gallium (Ga), and a source electrode disposed on the gate insulating film so as to be in contact with one side of the active layer and a drain electrode disposed on the gate insulating film so as to be in contact with the other side of the active layer, wherein, in the active layer, a content of the indium is greater than 25.3 wt % and less than 33.5 wt % and a content of the gallium is greater than 6.8 wt % and less than 16.9 wt %.

According to one embodiment, the active layer may have mobility of 26.0 $cm^2/Vs$ or greater.

According to one embodiment, the on/off ratio ($I_{ON}/I_{OFF}$) may be 6.2E+10 or greater.

Advantageous Effects

A method for manufacturing a semiconductor layer according to an embodiment of the present disclosure includes preparing a substrate, and conducting a first unit process of reacting a first precursor including indium (In) and a first reaction source and a second unit process of reacting a second precursor including gallium (Ga) and a second reaction source to form a semiconductor layer including the indium and the gallium on the substrate, wherein the first precursor and the second precursor may have the same ligand. Accordingly, the composition ratio is readily controlled in the semiconductor layer, and as a result, a transistor including the semiconductor layer can have enhanced electrical properties and reliability.

DESCRIPTIONS OF DRAWINGS

BEST MODE

Figure 1:
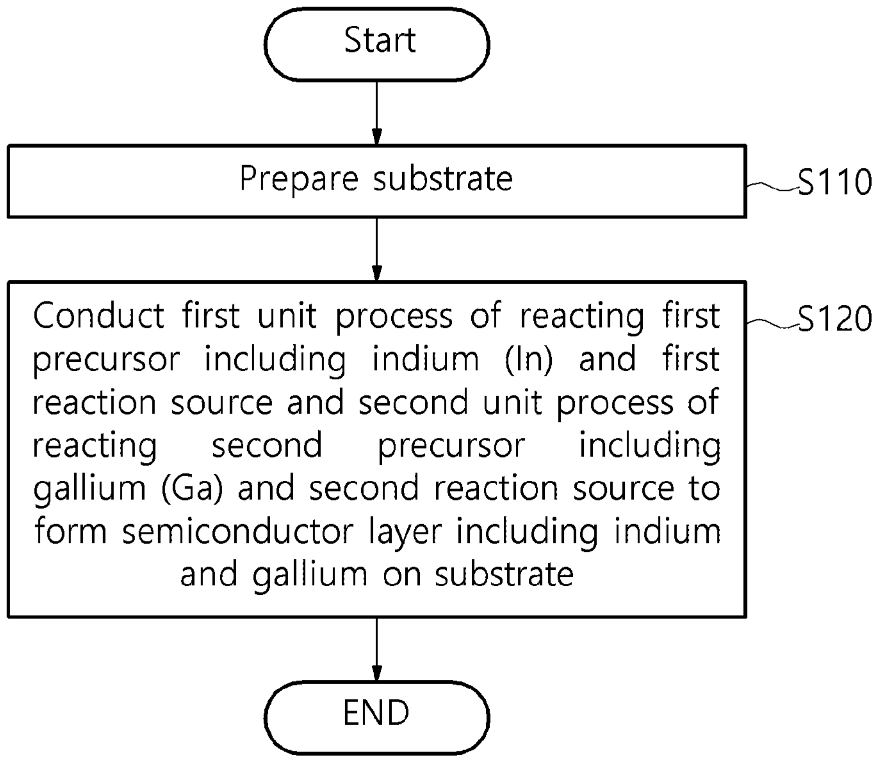
FIG. 1 is a flowchart illustrating a method for manufacturing a semiconductor layer according to a first embodiment of the present disclosure.

Hereinafter, preferred embodiments of the present disclosure will be described in detail with reference to accompanying drawings. However, technical ideas of the present disclosure are not limited to the embodiments described herein and may also be embodied in other forms. Rather, the embodiments introduced herein are provided so that the disclosure is thorough and complete and ideas of the present disclosure are sufficiently conveyed to those skilled in the art.

In the present specification, a description of a certain constituent being on another constituent means that the certain constituent may be directly formed on the another constituent or a third constituent may be provided therebetween. In addition, in the drawings, thicknesses of films and areas are exaggerated for effective descriptions of technical contents.

In addition, in various embodiments of the present specification, terms such as first, second and third are used to describe various constituents, however, these constituents should not be limited to such terms. These terms are used only to distinguish one constituent from another constituent. Accordingly, what is referred to as a first constituent in any one embodiment may also be referred to as a second constituent in another embodiment. Each embodiment described and illustrated herein also includes a complementary embodiment thereof. In addition, 'and/or' in the present specification is used as a meaning including at least one of constituents listed before and after.

In the specification, singular expressions include plural expressions unless the context clearly indicates otherwise. In addition, terms such as "include (comprise)" or "have" are to specify the presence of features, numbers, steps, constituents or combinations thereof described in the specification, and should not be construed as excluding possibility of presence or addition of one or more of other features, numbers, steps, constituents or combinations thereof. In addition, in the present specification, "connection" is used as a meaning that includes both indirectly connecting and directly connecting a plurality of constituents.

In addition, when it is determined that, in describing the present disclosure below, specific descriptions on relating known functions or constitutions may unnecessarily obscure the gist of the present disclosure, detailed descriptions thereon will not be included.

Figure 8:
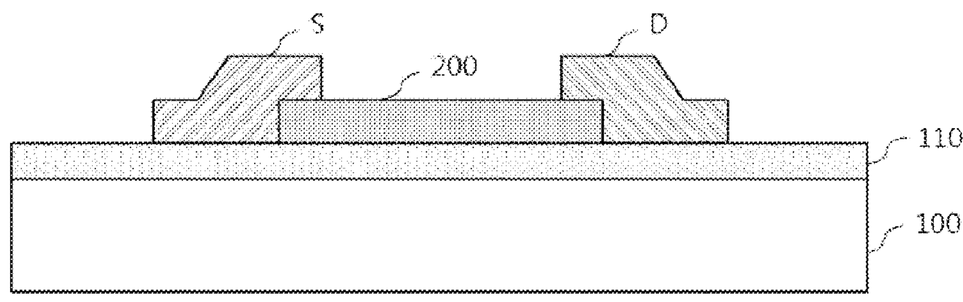
FIG. 8 is a diagram illustrating a transistor including the semiconductor layer according to the first embodiment of the present disclosure.

FIG. 1 is a flowchart illustrating a method for manufacturing the semiconductor layer according to a first embodiment of the present disclosure, FIGS. 2 to 7 are diagrams each illustrating a process for manufacturing a semiconductor layer according to the first embodiment of the present disclosure, and FIG. 8 is a diagram illustrating a transistor including the semiconductor layer according to the first embodiment of the present disclosure.

Figure 2:
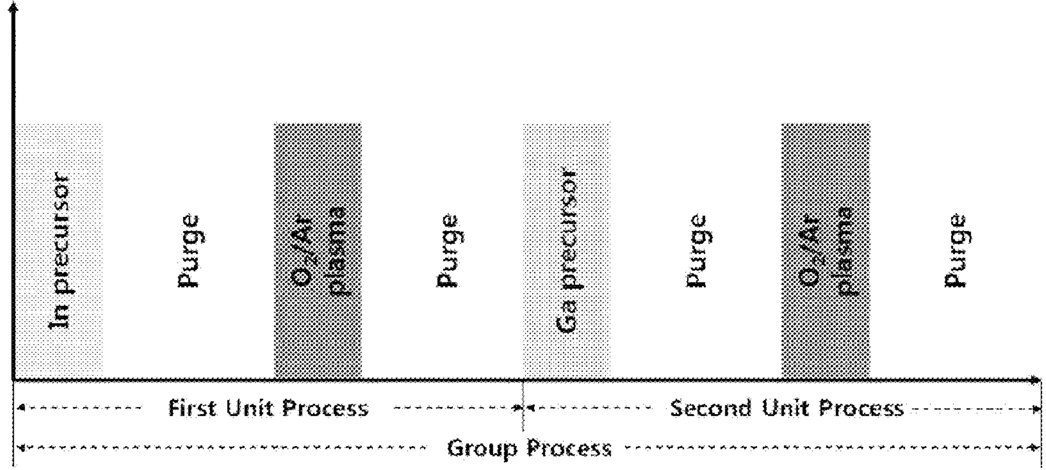
FIGS. 2 to 7 are diagrams each illustrating a process for manufacturing the semiconductor layer according to the first embodiment of the present disclosure.
Figure 3:
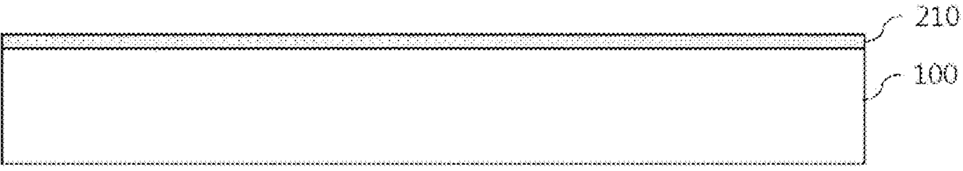
Figure 4:
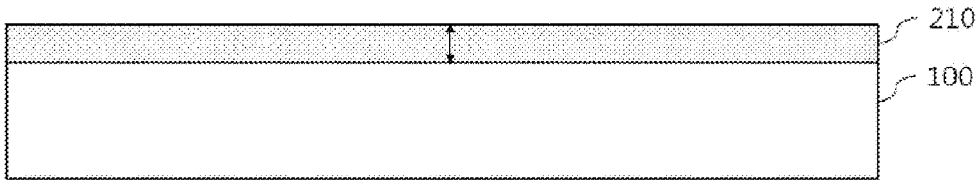
Figure 5:
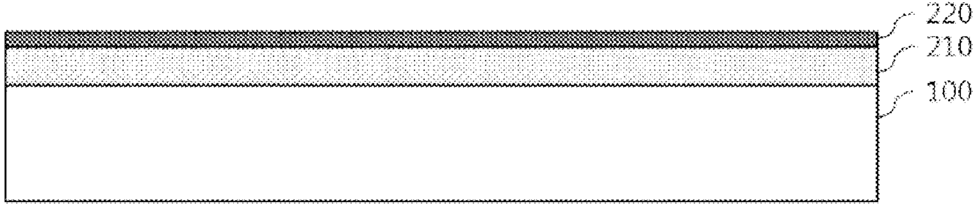
Figure 6:
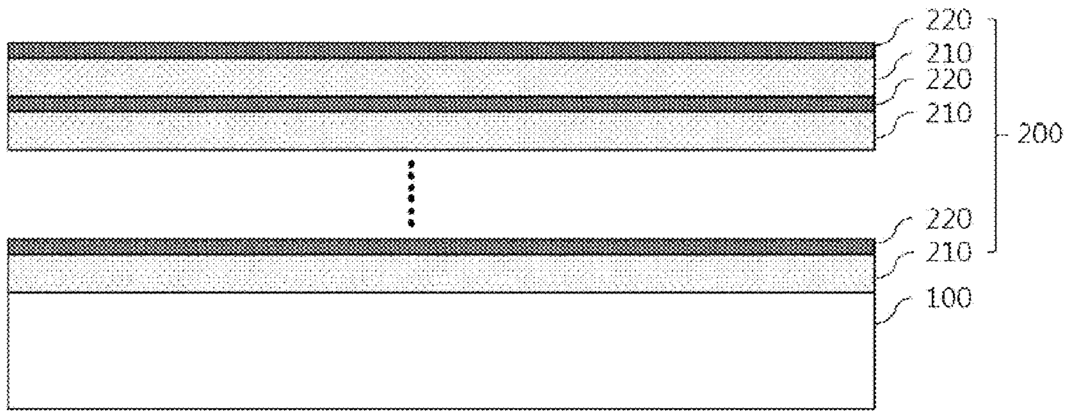
Figure 7:
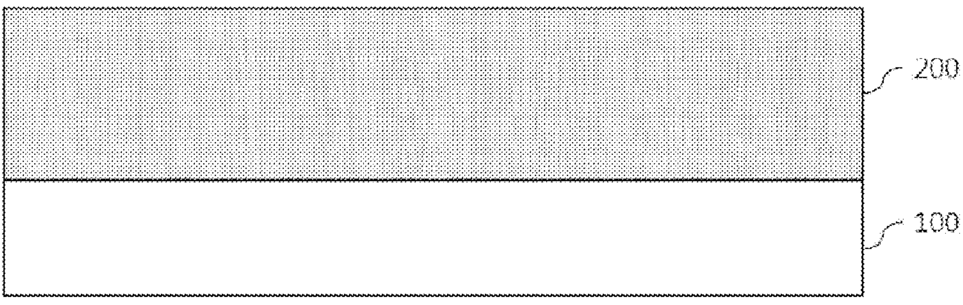

Referring to FIGS. 1 to 3, a substrate 100 is prepared (S110). According to one embodiment, the substrate 100 may be a semiconductor substrate. For example, the substrate 100 may be a silicon (Si) substrate. In contrast, according to another embodiment, the substrate 100 may be a metal substrate, a plastic substrate or a glass substrate. The type of the substrate 100 is not limited.

Referring to FIGS. 1 to 7, a semiconductor layer 200 may be formed on the substrate 100 (S120). According to one embodiment, the semiconductor layer 200 may be formed using an atomic layer deposition method. Specifically, the forming of a semiconductor layer 200 may include, as illustrated in FIGS. 1 and 2, providing a first precursor on the substrate 100, purging, providing a first reaction source on the first precursor-provided substrate 100, purging, providing a second precursor on the substrate 100, purging, providing a second reaction source on the second precursor-provided substrate 100, and purging.

According to one embodiment, the first precursor may include indium (In). In contrast, the second precursor may include gallium (Ga). However, the first precursor and the second precursor may have the same ligand. More specifically, the first precursor may include a compound represented by the following Chemical Formula 1, and the second precursor may include a compound represented by the following Chemical Formula 2.

[Chemical Formula 1]

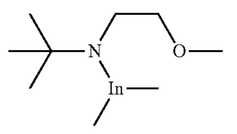

-continued

[Chemical Formula 2]

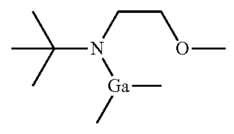

According to one embodiment, the first reaction source and the second reaction source may be the same as each other. For example, the first reaction source and the second reaction source may include a plasma in which oxygen ($O_2$) and argon (Ar) are mixed in a ratio of 50:50 wt %. When manufacturing a thin film through the plasma, quality may be enhanced compared to a thin film manufactured through an existing sputtering system.

When the first precursor includes indium (In), the second precursor includes gallium (Ga) and the first and second reaction sources include oxygen ($O_2$) as described above, the semiconductor layer 200 may include IGO.

The first precursor providing-purging-first reaction source providing-purging may be defined as a first unit process. In contrast, the second precursor providing-purging-second reaction source providing-purging may be defined as a second unit process. In addition, when the first unit process and the second unit process are performed sequentially, the first unit process and the second unit process may be defined as a group process.

According to one embodiment, when the first unit process is conducted, a first material layer 210 may be formed. In other words, the first precursor and the first reaction source may be reacted to form the first material layer 210. In contrast, when the second unit process is conducted, a second material layer 220 may be formed. In other words, the second precursor and the second reaction source may be reacted to form the second material layer 220.

According to one embodiment, the group process may be repeated. Accordingly, the first material layer 210 and the second material layer 220 may be alternately and repeatedly formed on the substrate 100. In this case, a plurality of the first material layers 210 and a plurality of the second material layers 220 may be defined as the semiconductor layer 200.

According to another embodiment, the first unit process and the second unit process may each be repeated a plurality of times. When the first unit process and the second unit process are repeated a plurality of times, thicknesses the first material layer 210 and the second material layer 220 may each be controlled. For example, when the number of repetitions of the first unit process increases, a thickness of the first material layer 210 may increase. In addition, when the number of repetitions of the second unit process increases, a thickness of the second material layer 220 may increase. Accordingly, the first material layer 210 and the second material layer 220 having the thicknesses controlled may be disposed on the substrate 100. In this case, the first material layer 210 and the second material layer 220 having the thicknesses controlled may be defined as the semiconductor layer 200.

As described above, the first precursor and the second precursor include the same ligand, and the semiconductor layer 200 may be formed through the first precursor providing-the second precursor providing-purging-reaction source providing-purging. The reaction source may be the same as the first and second reaction sources described above. This has advantages of reducing process costs and simplifying procedures since the number of purging decreases compared to the case of sequentially conducting the first unit process and the second unit process.

According to one embodiment, the semiconductor layer 200 may not be divided into the first material layer 210 and the second material layer 220. More specifically, when each of the first material layer 210 and the second material layer 220 does not have a predetermined thickness, the first material layer 210 and the second material layer 220 may not be visually divided in the semiconductor layer 200.

In contrast, according to another embodiment, the first material layer 210 and the second material layer 220 may be divided in the semiconductor layer 200. More specifically, when each of the first material layer 210 and the second material layer 220 is formed to have a predetermined thickness or greater, the first material layer 210 and the second material layer 220 may be visually divided in the semiconductor layer 200.

According to one embodiment, a ratio of the indium (In) and the gallium (Ga) in the semiconductor layer 200 may be controlled by controlling a ratio of the first unit process and the second unit process. For example, a repetition ratio of the first unit process may be controlled to greater than 3 times and less than 9 times with respect to a repetition ratio of the second unit process. In this case, the indium (In) content may be controlled to greater than 25.3 wt % and less than 33.5 wt %, and the gallium (Ga) content may be controlled to greater than 6.8 wt % and less than 16.9 wt % in the semiconductor layer 200. Accordingly, performance of a transistor including the semiconductor layer 200 may be enhanced. A specific structure of the transistor including the semiconductor layer 200 will be described later.

More specifically, when a repetition ratio of the first unit process:a repetition ratio of the second unit process is controlled to 4:1 or 6:1, electrical properties such as mobility and on/off ratio ($I_{ON}/I_{OFF}$) of the transistor including the semiconductor layer 200 may be enhanced. When a repetition ratio of the first unit process:a repetition ratio of the second unit process is 4:1, the indium (In) content may be 28.6 wt % and the gallium (Ga) content may be 12.6 wt % in the semiconductor layer 200. In contrast, when a repetition ratio of the first unit process:a repetition ratio of the second unit process is 6:1, the indium (In) content may be 31.3 wt % and the gallium (Ga) content may be 9.3 wt % in the semiconductor layer 200.

According to one embodiment, when the first precursor and the second precursor have the same ligand, an increased ratio of the number of repetitions of the first unit process with respect to the number of repetitions of the second unit process and a decreased ratio of the gallium (Ga) content with respect to the indium (In) content in the semiconductor layer 200 may be substantially constant. For example, when the number of repetitions of the first unit process increases by 100% with respect to the number of repetitions of the second unit process, the gallium (Ga) content with respect to the indium (In) content in the semiconductor layer 200 may decrease by approximately 100%.

Specifically, when the repetition ratio of the first unit process:the repetition ratio of the second unit process changes from 3:1 to 6:1, the indium (In) content: the gallium (Ga) content in the semiconductor layer 200 may change from 1:0.67 to 1:0.30. As a result, when the first precursor and the second precursor have the same ligand, the indium (In) content and the gallium (Ga) content in the semiconductor layer 200 may be readily controlled.

The semiconductor layer 200 may be heat treated. For example, the semiconductor layer 200 may be heat treated by ultraviolet (UV) rays. In contrast, as another example, the semiconductor layer 200 may be heat treated in a furnace.

According to one embodiment, a temperature of the heat treatment of the semiconductor layer 200 may be controlled depending on the number of repetitions of the first unit process and the number of repetitions of the second unit process. For example, when the number of repetitions of the first unit process:the number of repetitions of the second unit process is 4:1, the semiconductor layer 200 may be heat treated at higher than 350° C. and lower than 450° C. In contrast, as another example, when the number of repetitions of the first unit process:the number of repetitions of the second unit process is 6:1, the semiconductor layer 200 may be heat treated at higher than 300° C. and lower than 400° C. In this case, performance (for example, mobility, on/off ratio or the like) of the transistor including the semiconductor layer 200 may be enhanced.

The semiconductor layer 200 may be used as an active layer of the transistor. Specifically, as illustrated in FIG. 8, the transistor may include a substrate 100, a gate insulating film 110 disposed on the substrate 100, an active layer 200 disposed on the gate insulating film 110, and a source electrode (source, S) disposed on the gate insulating film 110 so as to be in contact with one side of the active layer 200 and a drain electrode (drain, D) disposed on the gate insulating film 110 so as to be in contact with the other side of the active layer 200.

In this case, the indium (In) content may be controlled to greater than 25.3 wt % and less than 33.5 wt % and the gallium (Ga) content may be controlled to greater than 6.8 wt % and less than 16.9 wt % in the active layer 200. In addition, the heat treatment temperature may be controlled to higher than 300° C. and lower than 400° C. or higher than 350° C. and lower than 450° C. in the process for manufacturing the active layer 200. Accordingly, a transistor having high mobility of 26.0 $cm^2/Vs$ or greater and a high on/off ratio ($I_{ON}/I_{OFF}$) of 6.2E+10 or greater may be provided.

The method for manufacturing a semiconductor layer according to a first embodiment of the present disclosure includes preparing the substrate 100, and conducting the first unit process of reacting the first precursor including the indium (In) and the first reaction source and the second unit process of reacting the second precursor including the gallium (Ga) and the second reaction source to form the semiconductor layer 200 including the indium and the gallium on the substrate 100, wherein the first precursor and the second precursor have the same ligand. Accordingly, the composition ratio is readily controlled in the semiconductor layer 200, and therefore, the transistor including the semiconductor layer 200 may have enhanced electrical properties and reliability.

Hereinbefore, the method for manufacturing a semiconductor layer according to the first embodiment of the present disclosure has been described. Hereinafter, a method for manufacturing a semiconductor layer according to a second embodiment of the present disclosure, which forms a semiconductor layer by reacting a precursor including indium (In) and a reaction source, will be described.

Figure 9:
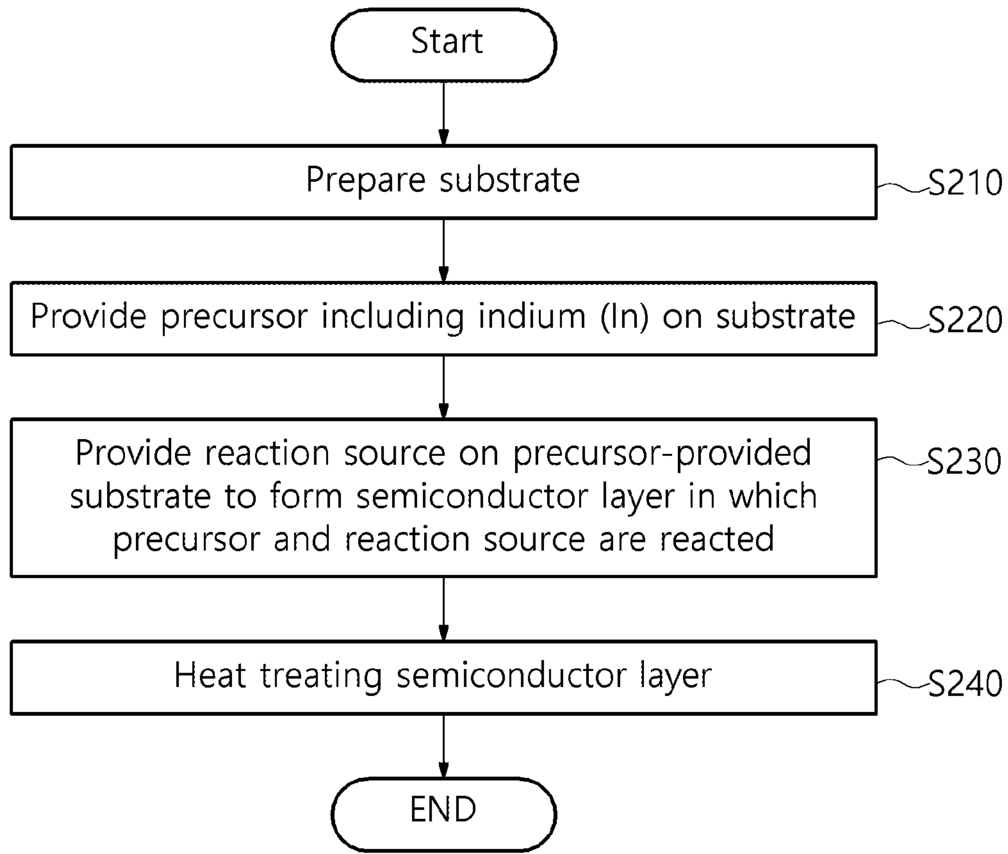
FIG. 9 is a flowchart illustrating a method for manufacturing a semiconductor layer according to a second embodiment of the present disclosure.
Figure 10:
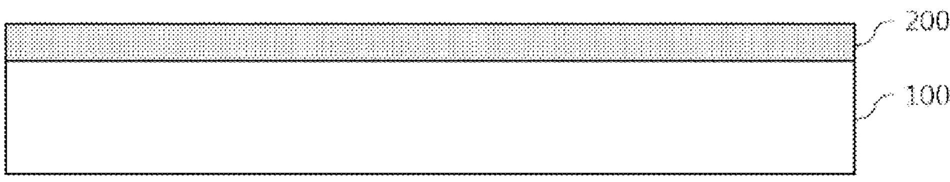
FIG. 10 is a diagram illustrating the semiconductor layer according to the second embodiment of the present disclosure.
Figure 11:
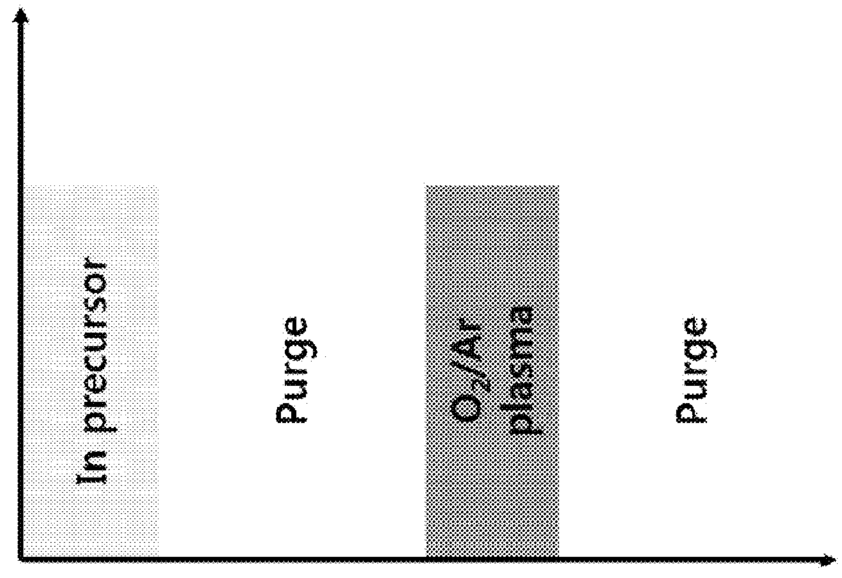
FIGS. 11 and 12 are diagrams each illustrating a process for manufacturing the semiconductor layer depending on a reaction source.
Figure 12:
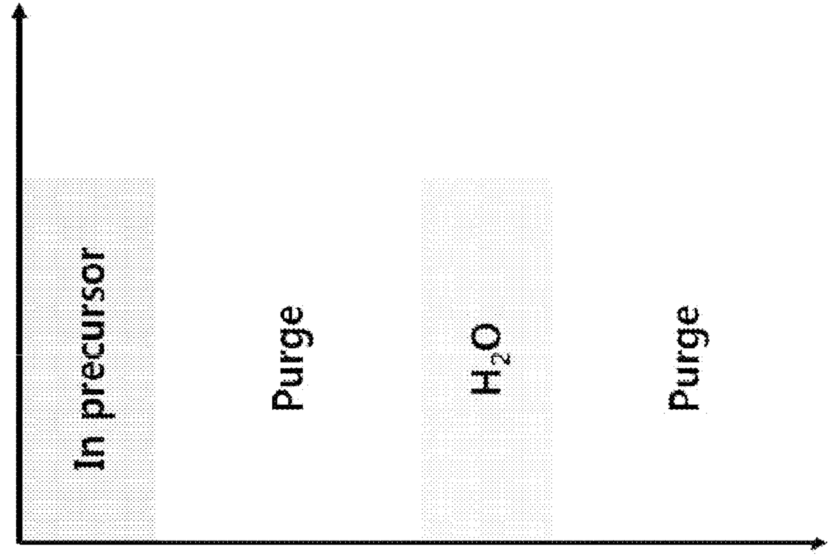

FIG. 9 is a flowchart illustrating a method for manufacturing a semiconductor layer according to a second embodiment of the present disclosure, FIG. 10 is a diagram illustrating the semiconductor layer according to the second embodiment of the present disclosure, and FIGS. 11 and 12 are diagrams each illustrating a process for manufacturing the semiconductor layer depending on a reaction source.

Referring to FIGS. 9 and 10, a substrate 100 is prepared (S210). According to one embodiment, the substrate 100 may be a semiconductor substrate. For example, the substrate 100 may be a silicon (Si) substrate. In contrast, according to another embodiment, the substrate 100 may be a metal substrate, a plastic substrate or a glass substrate. The type of the substrate 100 is not limited.

A precursor including indium (In) may be provided on the substrate 100 (S220). For example, the precursor may include a compound represented by the following Chemical Formula 1.

[Chemical Formula 1]

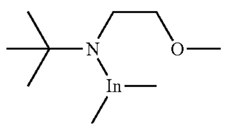

A reaction source may be provided on the precursor-provided substrate 100. In this case, the precursor and the reaction source may be reacted. Accordingly, a semiconductor layer 200 may be formed (S230). According to one embodiment, a purging process may be conducted before providing the reaction source and after providing the reaction source. In other words, the semiconductor layer 200 may be formed through the precursor providing-purging-the reaction source providing-purging. The forming of a semiconductor layer may be conducted at a first temperature.

According to one embodiment, the reaction source may include a plasma in which oxygen ($O_2$) and argon (Ar) are mixed in a ratio of 50:50 wt %. In contrast, according to another embodiment, the reaction source may include water ($H_2O$). Accordingly, the semiconductor layer 200 may include indium oxide ($In_xO_y$, x,y>0).

In other words, the semiconductor layer 200 may be manufactured through the precursor providing-purging-$O_2$/Ar plasma providing-purging as illustrated in FIG. 11, or manufactured through the precursor providing-purging-$H_2O$ providing-purging as illustrated in FIG. 12.

According to one embodiment, the first temperature may be controlled depending on the type of the reaction source. For example, when the reaction source includes a plasma in which oxygen ($O_2$) and argon (Ar) are mixed, the first temperature may be a heat treatment temperature of higher than 100° C. and lower than 250° C. In contrast, when the reaction source includes water ($H_2O$) as another example, the first temperature may be a heat treatment temperature of higher than 100° C. and lower than 200° C. In this case, performance (for example, mobility, on/off ratio or the like) of the transistor including the semiconductor layer 200 may be enhanced.

The semiconductor layer 200 may be heat treated at a second temperature (S240). For example, the semiconductor layer 200 may be heat treated by ultraviolet (UV) rays. In contrast, as another example, the semiconductor layer 200 may be heat treated in a furnace.

The method for manufacturing a semiconductor layer according to the second embodiment of the present disclosure includes preparing the substrate 100, providing the precursor including the indium on the substrate 100, providing the reaction source on the precursor-provided substrate 100 to form the semiconductor layer 200 in which the precursor and the reaction source are reacted, and heat treating the semiconductor layer 200, wherein, depending on the type of the reaction source, a temperature of the heat treatment of the semiconductor layer 200 is controlled. Accordingly, electrical properties of the transistor including the semiconductor layer 200 may be enhanced.

Hereinbefore, the method for manufacturing a semiconductor layer and the transistor according to embodiments of the present disclosure have been described. Hereinafter, specific experimental examples and property evaluation results for the method for manufacturing a semiconductor layer and the transistor according to embodiments of the present disclosure will be described.

Manufacture of Semiconductor Thin Film According to Example 1

An IGO semiconductor thin film according to Example 1 was manufactured by conducting first precursor providing-purging-$O_2$/Ar (50:50 wt %) plasma providing-purging-second precursor providing-purging-$O_2$/Ar (50:50 wt %) plasma providing-purging on a substrate. As the first precursor and the second precursor, compounds represented by the following Chemical Formula 1 and Chemical Formula 2 were respectively used.

[Chemical Formula 1]

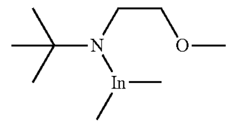

[Chemical Formula 2]

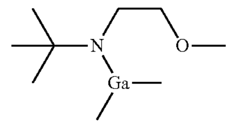

In the process described above, the first precursor providing-purging-$O_2$/Ar plasma providing-purging was defined as a first unit process, the second precursor providing-purging-$O_2$/Ar plasma providing-purging was defined as a second unit process, and each of the unit processes was repeated.

More specifically, the first unit process:the second unit process were repeated in a ratio of 2:1, 3:1, 4:1, 6:1, 9:1 and 19:1, and the semiconductor thin films each manufactured according to the ratios were defined as semiconductor thin films according to Example 1-1, Example 1-2, Example 1-3, Example 1-4, Example 1-5 and Example 1-6, respectively. The ratios of the first unit process:the second unit process in the processes for manufacturing the semiconductor thin film according to Examples 1-1 to 1-6 are summarized in the following Table 1.

TABLE 1

| Entry | First Unit Process (In):Second Unit Process (Ga) |
|---|---|
| Example 1-1 | 2:1 |
| Example 1-2 | 3:1 |
| Example 1-3 | 4:1 |
| Example 1-4 | 6:1 |
| Example 1-5 | 9:1 |
| Example 1-6 | 19:1 |

Manufacture of Semiconductor Thin Film According to Comparative Example 1

An IGO semiconductor thin film according to Comparative Example 1 was manufactured by conducting first precursor providing-purging-$O_2$/Ar (50:50 wt %) plasma providing-purging-second precursor providing-purging-$O_2$/Ar (50:50 wt %) plasma providing-purging on a substrate. DADI ([3-(dimethylamino) propyl]dimethyl indium) was used as the first precursor, and TMGa (trimethylgallium) was used as the second precursor.

In addition, as described in the semiconductor thin film according to Example 1, the ratio of the first unit process:the second unit process was controlled to 2:1, 3:1, 4:1, 6:1, 9:1 and 19:1, and the semiconductor thin film was manufactured according to each ratio. The semiconductor thin films each manufactured according to the ratios were defined as semiconductor thin films according to Comparative Examples 1-1 to 1-6, respectively.

Manufacture of Transistor According to Example 1

After forming a $SiO_2$ gate insulating film (100 nm thickness) on a Si gate, each of the semiconductor thin films (20 nm thickness) according to Examples 1-1 to 1-6, an ITO source electrode (100 nm thickness) and an ITO drain electrode (100 nm thickness) were formed on the gate insulating film to respectively manufacture transistors according to Examples 1-1 to 1-6.

Figure 13:
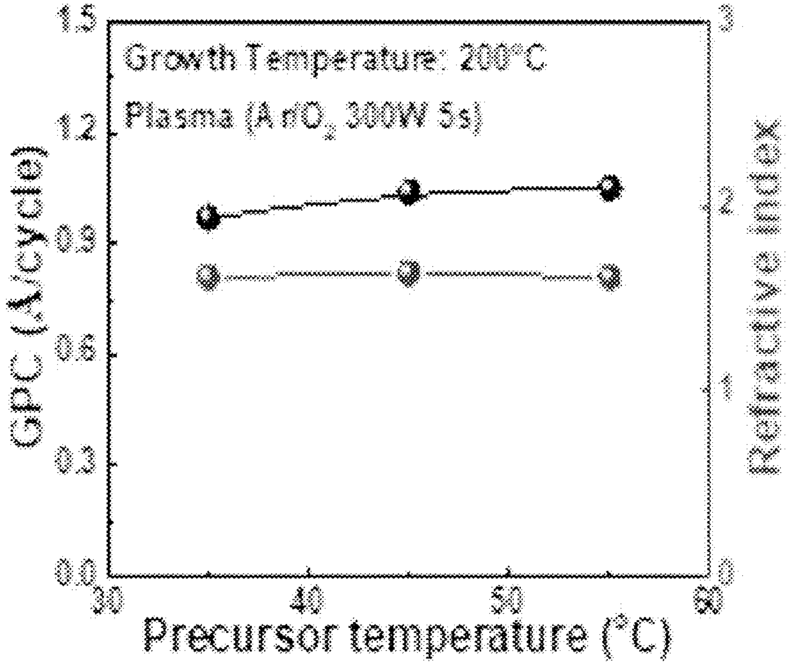
FIG. 13 is a graph showing an In growth rate in a semiconductor thin film according to Example 1 of the present disclosure.
Figure 14:
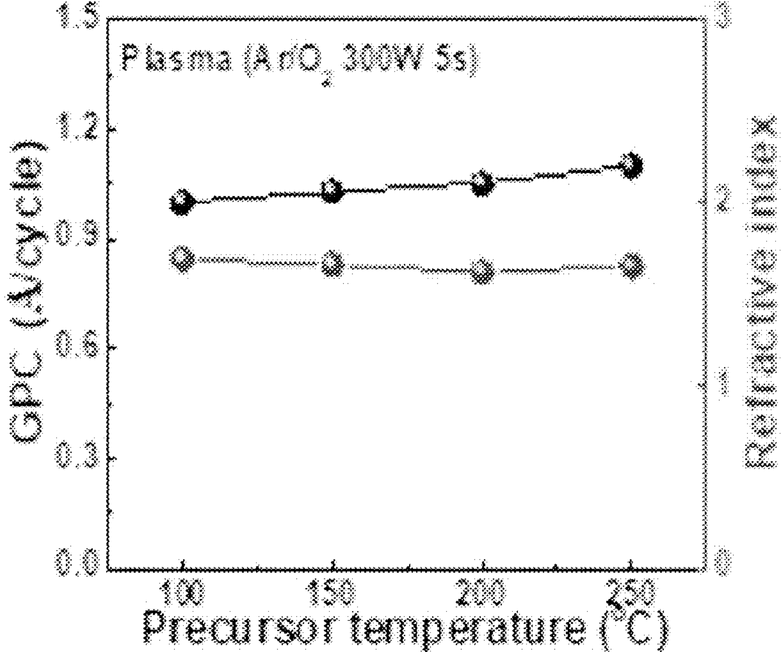
FIG. 14 is a graph showing a Ga growth rate in the semiconductor thin film according to Example 1 of the present disclosure.

FIG. 13 is a graph showing an In growth rate in the semiconductor thin film according to Example 1 of the present disclosure, and FIG. 14 is a graph showing a Ga growth rate in the semiconductor thin film according to Example 1 of the present disclosure.

Referring to FIGS. 13 and 14, the semiconductor thin film according to Example 1 was prepared, and GPC (Å/cycle) and refractive index depending on the temperatures of the first precursor and the second precursor (precursor temperature, ° C.) were measured and shown. The overall growth temperature of the semiconductor thin film was controlled to 200° C., and the $O_2$/Ar plasma was controlled at 300 W and 5 s. In addition, calculated deposition rates and actual deposition rates of the semiconductor thin films according to Examples 1-2 to 1-6 were measured, and the results are summarized in the following Table 2.

TABLE 2

| Entry | Ga % | Calculated GPC (Å/Cycle) | Experimental GPC (Å/Cycle) |
|---|---|---|---|
| Example 1-2 (3:1) | 25 | 4.2 | 4.0 |
| Example 1-3 (4:1) | 20 | 5.3 | 5.3 |
| Example 1-4 (6:1) | 15 | 7.4 | 7.6 |
| Example 1-5 (9:1) | 10 | 10.6 | 10.9 |
| Example 1-6 (19:1) | 5 | 21.2 | 22.8 |

As identified in Table 2, it was identified that the calculated deposition rate and the actual deposition rate were identical in the semiconductor thin film according to Example 1-3. In addition, composition ratios of the semiconductor thin films according to Examples 1-2 to 1-6 and composition ratios of the semiconductor thin films according to Comparative Examples 1-2 to 1-6 were measured. The composition ratios of the semiconductor thin films according to Examples 1-2 to 1-6 are summarized in the following Table 3, and the composition ratios of the semiconductor thin films according to Comparative Examples 1-2 to 1-6 are summarized in the following Table 4.

TABLE 3

| Entry | C % | In % | Ga % | O % | In:Ga Ratio |
|---|---|---|---|---|---|
| Example 1-2 (3:1) | 2.0 | 25.3 | 16.9 | 55.8 | 1:0.67 |
| Example 1-3 (4:1) | 2.0 | 28.6 | 12.6 | 56.8 | 1:0.44 |
| Example 1-4 (6:1) | 1.9 | 31.3 | 9.3 | 57.4 | 1:0.30 |

TABLE 3-continued

| Entry | C % | In % | Ga % | O % | In:Ga Ratio |
|---|---|---|---|---|---|
| Example 1-5 (9:1) | 1.8 | 33.5 | 6.8 | 57.9 | 1:0.20 |
| Example 1-6 (19:1) | 1.7 | 36.0 | 3.6 | 58.7 | 1:0.10 |

TABLE 4

| Entry | C % | In % | Ga % | O % | In:Ga Ratio |
|---|---|---|---|---|---|
| Comparative Example 1-2 (3:1) | 0.5 | 22.2 | 23.9 | 53.5 | 1:1.07 |
| Comparative Example 1-3 (4:1) | 0.4 | 24.6 | 20.7 | 54.4 | 1:0.84 |
| Comparative Example 1-4 (6:1) | 0.5 | 27.6 | 17.5 | 54.4 | 1:0.71 |
| Comparative Example 1-5 (9:1) | 0.2 | 31.0 | 13.5 | 55.2 | 1:0.44 |
| Comparative Example 1-6 (19:1) | 0.5 | 35.1 | 8.1 | 56.3 | 1:0.23 |

As identified in <Table 3>, it was identified that, in the semiconductor thin film according to Example 1 manufactured using the precursor having the same ligand, the In:Ga ratio decreased from 1:0.67 to 1:0.30 when the ratio of the first unit process:the second unit process increased from 3:1 to 6:1. In other words, it was identified that, as the ratio of the number of repetitions of the first unit process to the second unit process increased by 100% (3→6), the ratio of Ga to In decreased by approximately 100% (0.67→0.30). On the other hand, as identified in Table 4, in the semiconductor thin film according to Comparative Example 1 manufactured using the precursor having a different ligand, the In:Ga ratio decreased from 1:1.07 to 1:0.71 when the ratio of the first unit process:the second unit process increased from 3:1 to 6:1. In other words, it was identified that, as the ratio of the number of repetitions of the first unit process to the second unit process increased by 100% (3→6), the ratio of Ga to In decreased by approximately 50% (1.07→0.71).

In other words, it was seen that, when manufacturing the semiconductor thin film using the precursor having the same ligand, the ratio of increase in the number of repetitions of the first unit process with respect to the number of repetitions of the second unit process and the ratio of decrease in the gallium (Ga) content with respect to the indium (In) content in the semiconductor thin film were substantially constant. As a result, it is seen that, when manufacturing an IGO thin film using a precursor having the same ligand, the In content and the Ga content in the IGO thin film may be readily controlled by controlling a sequence of the ALD process.

Figure 15:
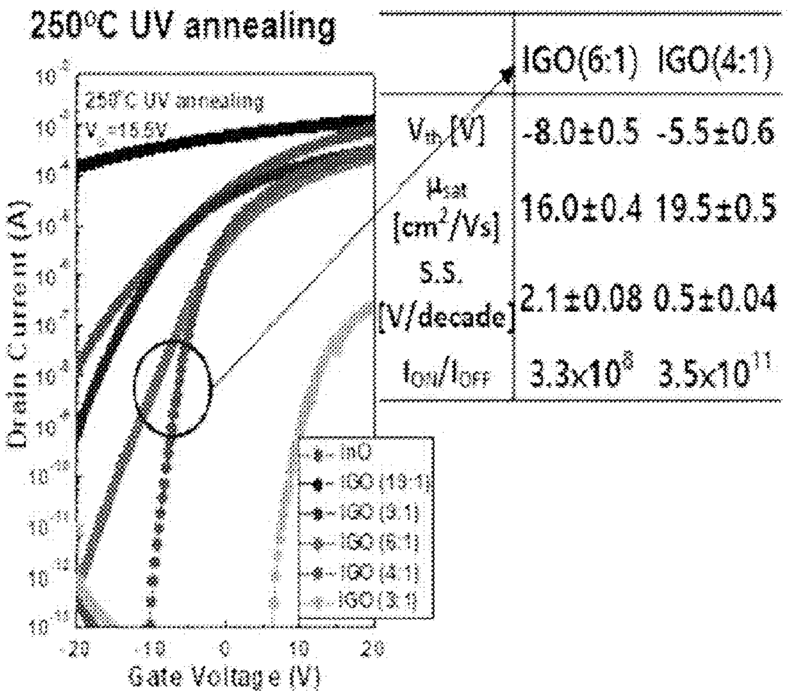
FIGS. 15 and 16 are graphs showing electrical properties of a transistor according to Example 1 including the semiconductor thin film according to Example 1 UV annealed.
Figure 16:
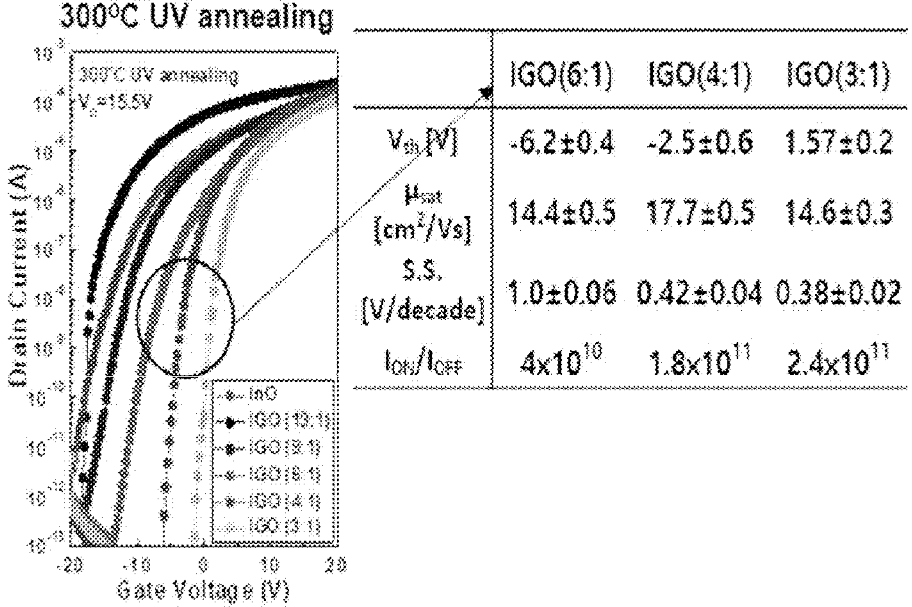

FIGS. 15 and 16 are graphs showing electrical properties of the transistor according to Example 1 including the semiconductor thin film according to Example 1 UV annealed.

Referring to FIGS. 15 and 16, the transistors according to Examples 1-2 to 1-6 were prepared, the semiconductor thin film included in each of the transistors was UV annealed at a temperature of 250° C. and a temperature of 300° C., and electrical properties for each were measured and shown.

As identified in FIGS. 15 and 16, it was identified that, as the Ga ratio increased in the semiconductor thin film, Vth of the transistor was positively shifted, and the slope gradually increased. Particularly, it was identified that the transistor according to Example 1-3 (4:1) had highest mobility ($\mu_{sat}$, $cm^2/Vs$) and on/off ratio ($I_{ON}/I_{OFF}$) regardless of the UV annealing temperature.

FIGS. 17 to 20 are graphs showing electrical properties of the transistor according to Example 1 including the semiconductor thin film according to Example 1 heat treated in a furnace.

Figure 17:
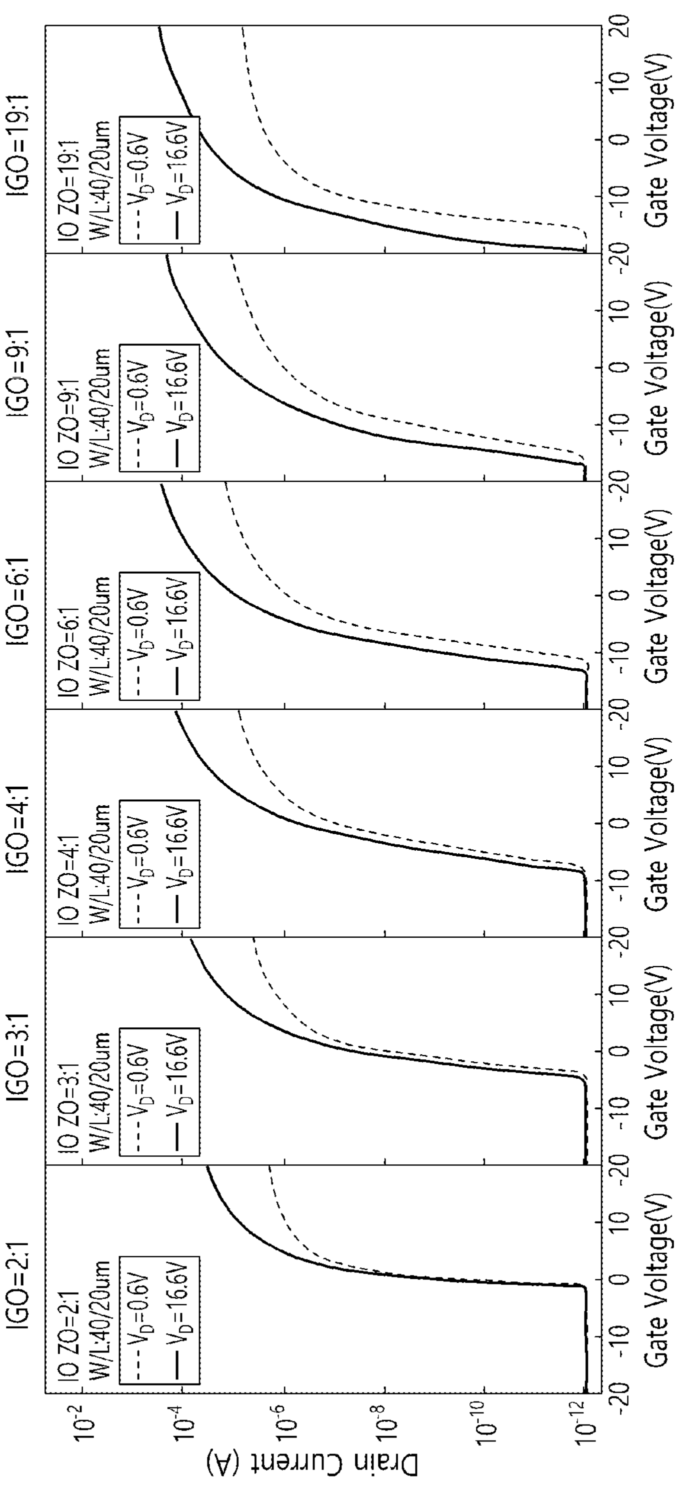
FIGS. 17 to 20 are graphs showing electrical properties of a transistor according to Example 1 including the semiconductor thin film according to Example 1 heat treated in a furnace.
Figure 18:
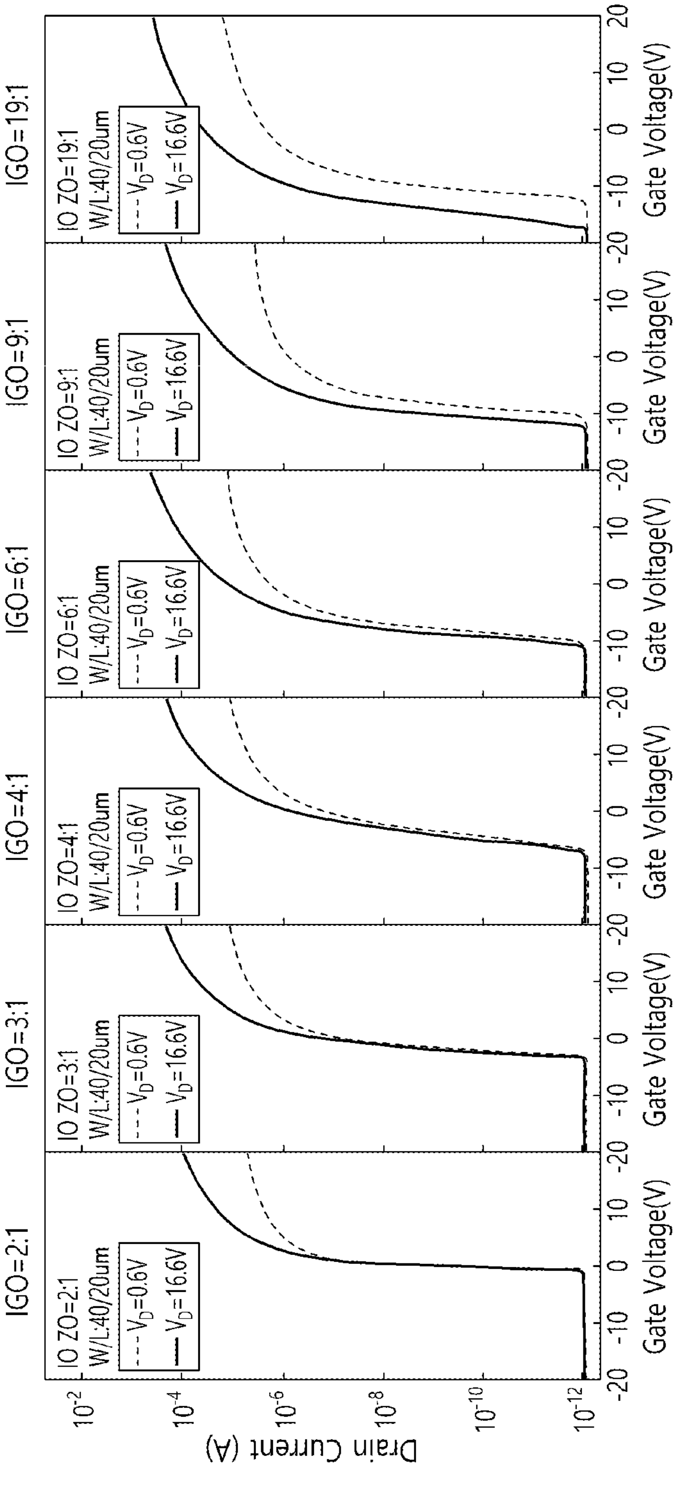
Figure 19:
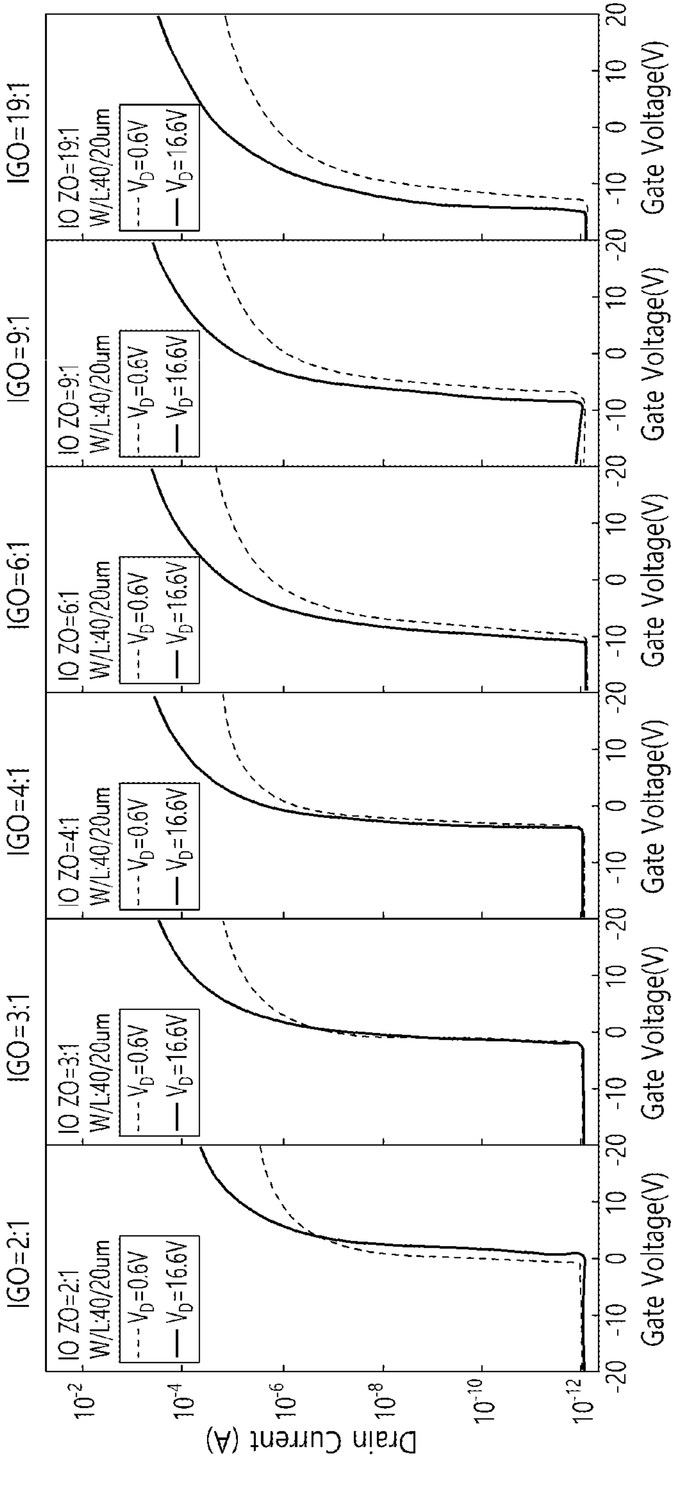
Figure 20:
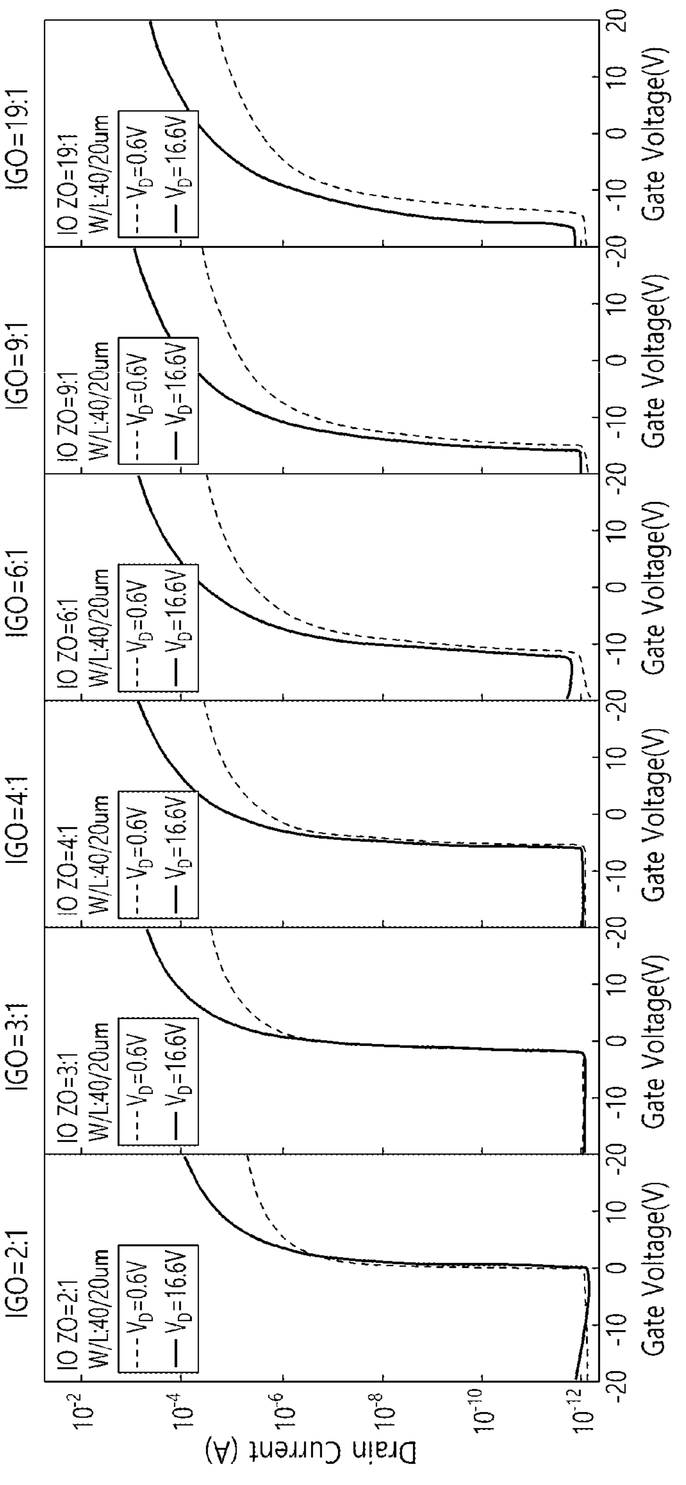

Referring to FIGS. 17 to 20, the transistors according to Examples 1-1 to 1-6 were prepared, the semiconductor thin film included in each of the transistors was heat treated for 3 hours at temperatures of 300° C., 350° C., 400° C. and 450° C., and electrical properties for each were measured and shown. More specifically, FIG. 17 shows electrical properties of the transistor including the semiconductor thin film heat treated at 300° C., and the results are summarized in the following Table 5. In addition, FIG. 18 shows electrical properties of the transistor including the semiconductor thin film heat treated at 350° C., and the results are summarized in the following Table 6. In addition, FIG. 19 shows electrical properties of the transistor including the semiconductor thin film heat treated at 400° C., and the results are summarized in the following Table 7. In addition, FIG. 20 shows electrical properties of the transistor including the semiconductor thin film heat treated at 450° C., and the results are summarized in the following Table 8.

TABLE 5

| Entry | $V_{th}$ [V] | $\mu_{sat}$ [$cm^2$/Vs] | $\mu_{seff}$ [cm]$^2$/Vs] | S.S. [V/decade] | Hysteresis [V] | $I_{ON}$/ $I_{OFF}$ |
|---|---|---|---|---|---|---|
| Example 1-1 (2:1) | −1.0 ± 0.3 | 3.2 ± 0.7 | 3.4 ± 0.3 | 0.29 ± 0.02 | 0.4 ± 0.06 | 1.4E+8 |
| Example 1-2 (3:1) | −4.6 ± 0.2 | 6.2 ± 0.3 | 7.7 ± 0.8 | 0.69 ± 0.04 | 0.7 ± 0.19 | 1.8E+9 |
| Example 1-3 (4:1) | −7.9 ± 0.4 | 11.7 ± 0.3 | 14.5 ± 0.5 | 0.73 ± 0.08 | 0.6 ± 0.07 | 1.6E+9 |
| Example 1-4 (6:1) | −12.7 ± 0.2 | 15.1 ± 0.6 | 24.7 ± 0.9 | 0.73 ± 0.07 | 0.4 ± 0.09 | 7.5E+11 |
| Example 1-5 (9:1) | −16.5 ± 0.2 | 11.7 ± 1.3 | 21.7 ± 1.12 | 0.77 ± 0.09 | 0.2 ± 0.09 | 5.6E+9 |
| Example 1-6 (19:1) | −17.4 ± 0.6 | 13.1 ± 1.4 | 27.1 ± 0.03 | 0.60 ± 0.08 | 1.33 ± 0.42 | 1.6E+9 |

TABLE 6

| Entry | $V_{th}$ [V] | $\mu_{sat}$ [$cm^2$/Vs] | $\mu_{seff}$ [cm]$^2$/Vs] | S.S. [V/decade] | Hysteresis [V] | $I_{ON}$/ $I_{OFF}$ |
|---|---|---|---|---|---|---|
| Example 1-1 (2:1) | −0.6 ± 0.2 | 6.5 ± 0.4 | 6.8 ± 0.5 | 0.29 ± 0.03 | 0.48 ± 0.01 | 2.9E+8 |
| Example 1-2 (3:1) | −3.1 ± 0.1 | 14.6 ± 0.8 | 15.4 ± 0.7 | 0.46 ± 0.02 | 0.22 ± 0.05 | 6.0E+8 |
| Example 1-3 (4:1) | −6.1 ± 0.5 | 14.2 ± 0.5 | 16.6 ± 0.7 | 0.62 ± 0.03 | 0.20 ± 0.01 | 4.5E+9 |
| Example 1-4 (6:1) | −10.1 ± 0.2 | 19.2 ± 0.3 | 28.7 ± 0.7 | 0.49 ± 0.02 | 0.27 ± 0.30 | 1.1E+10 |
| Example 1-5 (9:1) | −11.8 ± 1.1 | 11.2 ± 0.1 | 17.5 ± 2.5 | 0.44 ± 0.11 | 0.71 ± 0.46 | 1.6E+10 |
| Example 1-6 (19:1) | −16.8 ± 1.3 | 13.7 ± 0.6 | 23.5 ± 3.5 | 0.60 ± 0.03 | 1.33 ± 0.01 | 3.1E+9 |

TABLE 7

| Entry | $V_{th}$ [V] | $\mu_{sat}$ [$cm^2$/Vs] | $\mu_{seff}$ [cm]$^2$/Vs] | S.S. [V/decade] | Hysteresis [V] | $I_{ON}$/ $I_{OFF}$ |
|---|---|---|---|---|---|---|
| Example 1-1 (2:1) | −1.2 ± 0.1 | 3.7 ± 0.1 | 3.8 ± 0.1 | 0.33 ± 0.01 | 0.9 ± 0.09 | 1.1E+8 |
| Example 1-2 (3:1) | −1.8 ± 0.1 | 18.8 ± 1.3 | 22.0 ± 1.7 | 0.38 ± 0.01 | 0.3 ± 0.01 | 3.5E+9 |
| Example 1-3 (4:1) | −4.0 ± 0.6 | 25.0 ± 1.3 | 33.5 ± 0.6 | 0.33 ± 0.02 | 0.2 ± 0.09 | 6.2E+10 |
| Example 1-4 (6:1) | −10.9 ± 0.2 | 17.9 ± 1.7 | 30.1 ± 0.3 | 0.48 ± 0.02 | 0.1 ± 0.06 | 8.5E+9 |
| Example 1-5 (9:1) | −8.8 ± 0.3 | 18.7 ± 0.3 | 30.8 ± 0.8 | 0.45 ± 0.01 | 0.3 ± 0.11 | 2.9E+10 |
| Example 1-6 (19:1) | −13.2 ± 0.6 | 10.9 ± 0.5 | 21.6 ± 0.5 | 0.60 ± 0.16 | 0.8 ± 0.61 | 2.2E+9 |

TABLE 8

| Entry | $V_{th}$ [V] | $\mu_{sat}$ [$cm^2$/Vs] | $\mu_{seff}$ [cm]$^2$/Vs] | S.S. [V/decade] | Hysteresis [V] | $I_{ON}$/ $I_{OFF}$ |
|---|---|---|---|---|---|---|
| Example 1-1 (2:1) | 0.2 ± 0.1 | 4.9 ± 0.1 | 4.9 ± 0.1 | 0.27 ± 0.02 | 0.53 ± 0.08 | 2.3E+9 |
| Example 1-2 (3:1) | −1.6 ± 0.1 | 24.2 ± 0.3 | 28.9 ± 0.4 | 0.27 ± 0.02 | 0.15 ± 0.08 | 5.3E+9 |

TABLE 8-continued

| Entry | $V_{th}$ [V] | $\mu_{sat}$ [cm$^2$/Vs] | $\mu_{seff}$ [cm]$^2$/Vs] | S.S. [V/decade] | Hysteresis [V] | $I_{ON}$/ $I_{OFF}$ |
|---|---|---|---|---|---|---|
| Example 1-3 (4:1) | −5.5 ± 0.4 | 26.0 ± 0.3 | 36.7 ± 0.4 | 0.32 ± 0.02 | 0.17 ± 0.08 | 8.7E+9 |
| Example 1-4 (6:1) | −12.6 ± 0.8 | 17.8 ± 0.4 | 30.6 ± 0.4 | 0.50 ± 0.03 | 0.07 ± 0.04 | 1.4E+10 |
| Example 1-5 (9:1) | −15.5 ± 0.5 | 17.0 ± 0.3 | 35.0 ± 0.6 | 0.39 ± 0.03 | 0.11 ± 0.07 | 6.1E+10 |
| Example 1-6 (19:1) | −15.8 ± 0.3 | 11.0 ± 0.1 | 22.8 ± 0.2 | 0.53 ± 0.06 | 0.20 ± 0.07 | 9.1E+9 |

In addition, mobility and on/off ratio depending on the heat treatment temperature of the semiconductor thin film of each of the transistors according to Examples 1-3 and 1-4 are summarized in the following Table 9 and Table 10.

TABLE 9

| Entry | $\mu_{sat}$ [cm$^2$/Vs] | $I_{ON}/I_{OFF}$ |
|---|---|---|
| 300° C. | 11.7 ± 0.3 | 1.6E+9 |
| 350° C. | 14.2 ± 0.5 | 4.5E+9 |
| 400° C. | 25.0 ± 1.3 | 6.2E+10 |
| 450° C. | 26.0 ± 0.3 | 8.7E+9 |

As identified in Table 9, it was identified that, when the number of repetitions of the first unit process:the number of repetitions of the second unit process is 4:1, mobility ($\mu_{sat}$) increased as the temperature increased. However, it was identified that, the on/off ratio ($I_{ON}/I_{OFF}$) gradually increased up to 400° C., and then decreased again after 400° C.

TABLE 10

| Entry | $\mu_{sat}$ [cm$^2$/Vs] | $I_{ON}/I_{OFF}$ |
|---|---|---|
| 300° C. | 15.1 ± 0.6 | 7.5E+11 |
| 350° C. | 19.2 ± 0.3 | 1.1E+10 |
| 400° C. | 17.9 ± 1.7 | 8.5E+9 |
| 450° C. | 17.8 ± 0.4 | 1.4E+10 |

As identified in Table 10, it was identified that, when the number of repetitions of the first unit process:the number of repetitions of the second unit process is 6:1, mobility ($\mu_{sat}$) and on/off ratio ($I_{ON}/I_{OFF}$) increased up to the temperature of 350° C., and then decreased thereafter. As a result, as seen from Table 9 and Table 10, it is seen that electrical properties of the transistor are enhanced by controlling the heat treatment temperature of the semiconductor thin film to higher than 350° C. and lower than 450° C. when the ratio of the number of repetitions of the first unit process:the second unit process is 4:1, and controlling the heat treatment temperature of the semiconductor thin film to higher than 300° C. and lower than 400° C. when the ratio of the number of repetitions of the first unit process:the second unit process is 6:1.

Manufacture of Semiconductor Thin Film According to Example 2

A thin film was manufactured by conducting In precursor providing-purging-$O_2$/Ar (50:50 wt %) plasma providing-purging on a substrate, and the manufactured thin film was UV annealed for 1 hour at a temperature of 250° C. to manufacture an $In_2O_3$ semiconductor thin film according to Example 2. As the In precursor, a compound represented by the following Chemical Formula 1 was used.

[Chemical Formula 1]

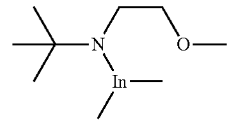

In addition, the process temperature of the In precursor providing-purging-$O_2$/Ar (50:50 wt %) plasma providing-purging was controlled to 100° C., 150° C., 200° C. and 250° C. to manufacture the semiconductor thin film, and the thin films manufactured at each temperature were defined as semiconductor thin films according to Examples 2-1, 2-2, 2-3 and 2-4, respectively. The process temperatures of the semiconductor thin films according to Examples 2-1, 2-2, 2-3 and 2-4 are summarized in the following Table 11.

TABLE 11

| Entry | ALD Process Temperature |
|---|---|
| Example 2-1 | 100° C. |
| Example 2-2 | 150° C. |
| Example 2-3 | 200° C. |
| Example 2-4 | 250° C. |

Manufacture of Transistor According to Example 2

After forming a $SiO_2$ gate insulating film (100 nm thickness) on a Si gate, each of the semiconductor thin films (20 nm thickness) according to Examples 2-1 to 2-4, an ITO source electrode (100 nm thickness) and an ITO drain electrode (100 nm thickness) were formed on the gate insulating film to manufacture each of transistors according to Examples 2-1 to 2-4.

Figure 21:
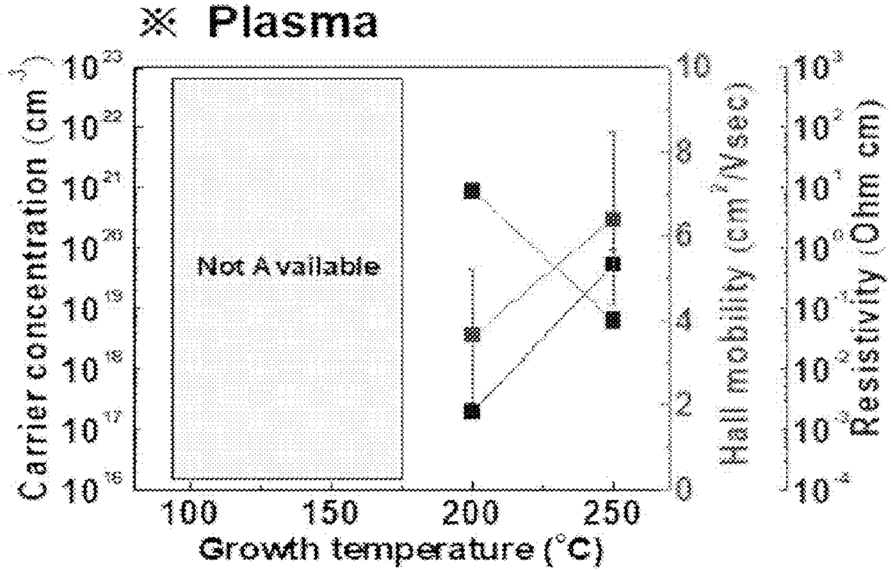
FIG. 21 is a graph showing electrical properties of a semiconductor thin film according to Example 2 of the present disclosure.

FIG. 21 is a graph showing electrical properties of the semiconductor thin film according to Example 2 of the present disclosure.

Referring to FIG. 21, carrier concentration (cm$^{-3}$), hall mobility (cm$^2$/Vsec) and resistivity (Ohm cm) were measured and shown for each of the semiconductor thin films according to Examples 2-1 (100° C.), 2-2 (150° C.), 2-3 (200° C.) and 2-4 (250° C.).

As identified in FIG. 21, it was identified that, in the semiconductor thin film according to Example 2, carrier concentration and hall mobility increased and resistivity decreased as the process temperature of the semiconductor thin film increased.

Figure 22:
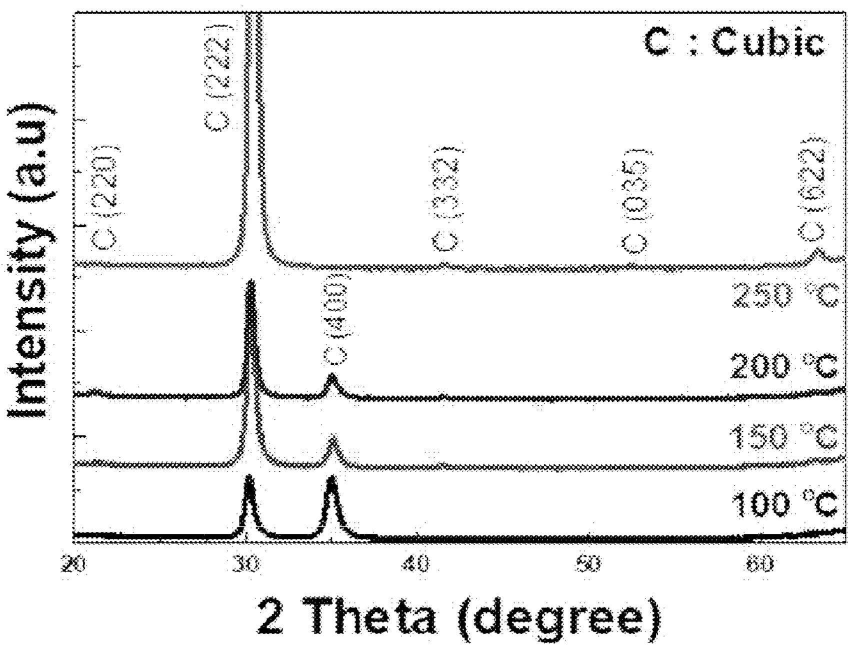
FIG. 22 is a graph showing a structure of the semiconductor thin film according to Example 2 of the present disclosure.
Figure 23:
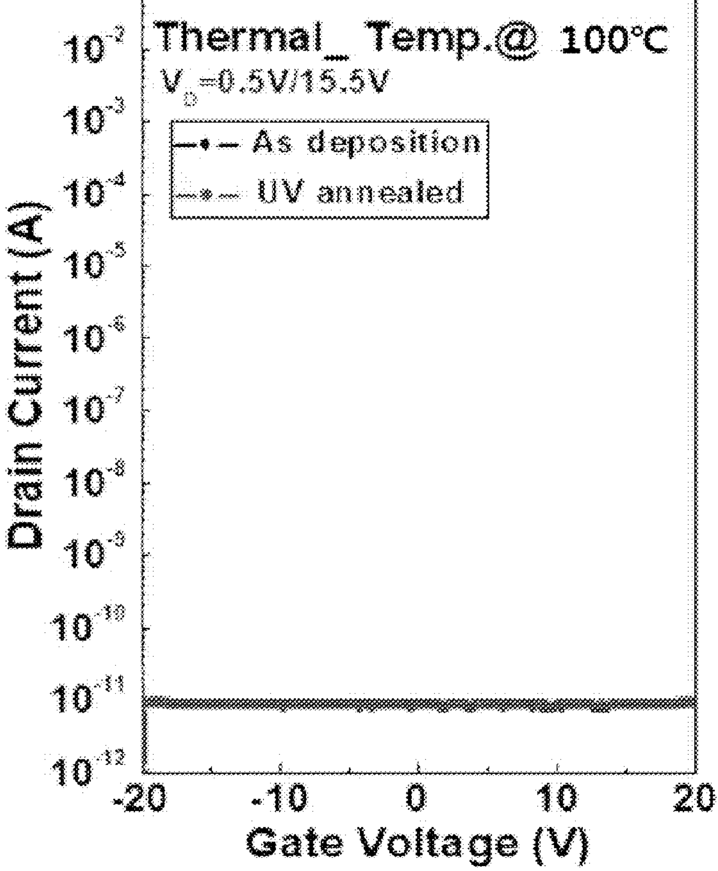
FIGS. 23 to 26 are graphs showing electrical properties of a transistor according to Example 2 of the present disclosure.
Figure 24:
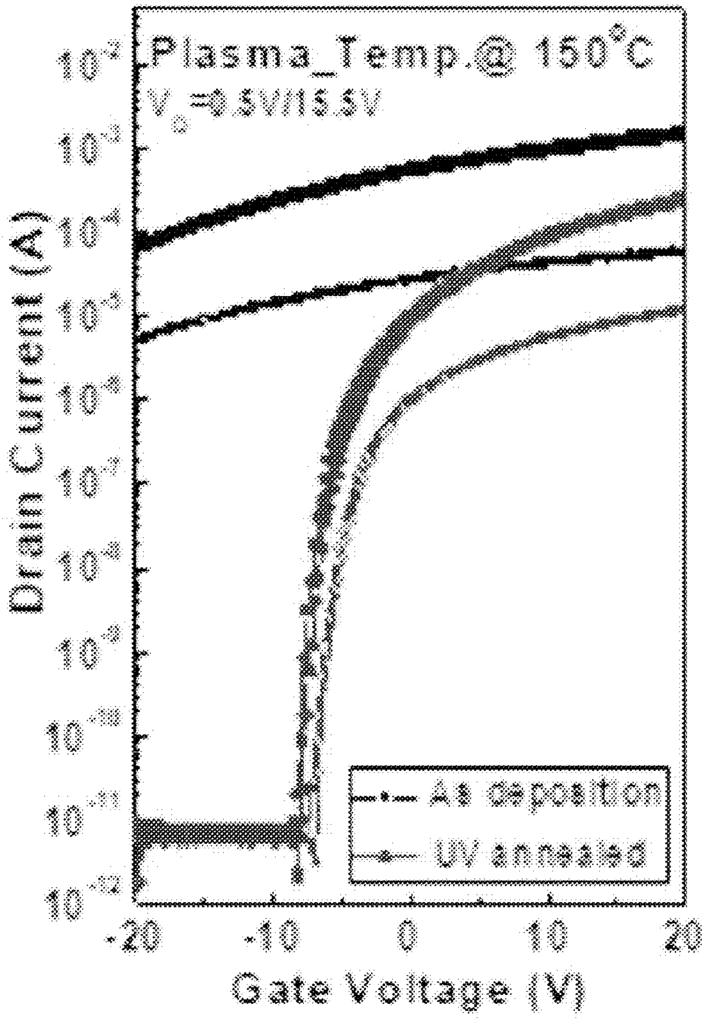
Figure 25:
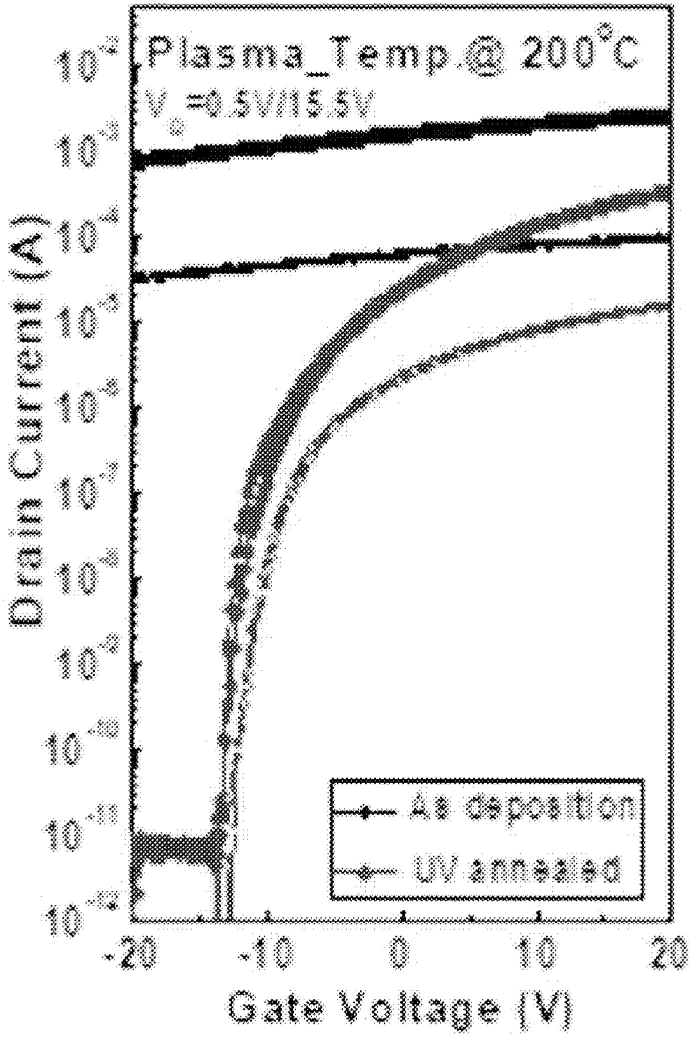
Figure 26:
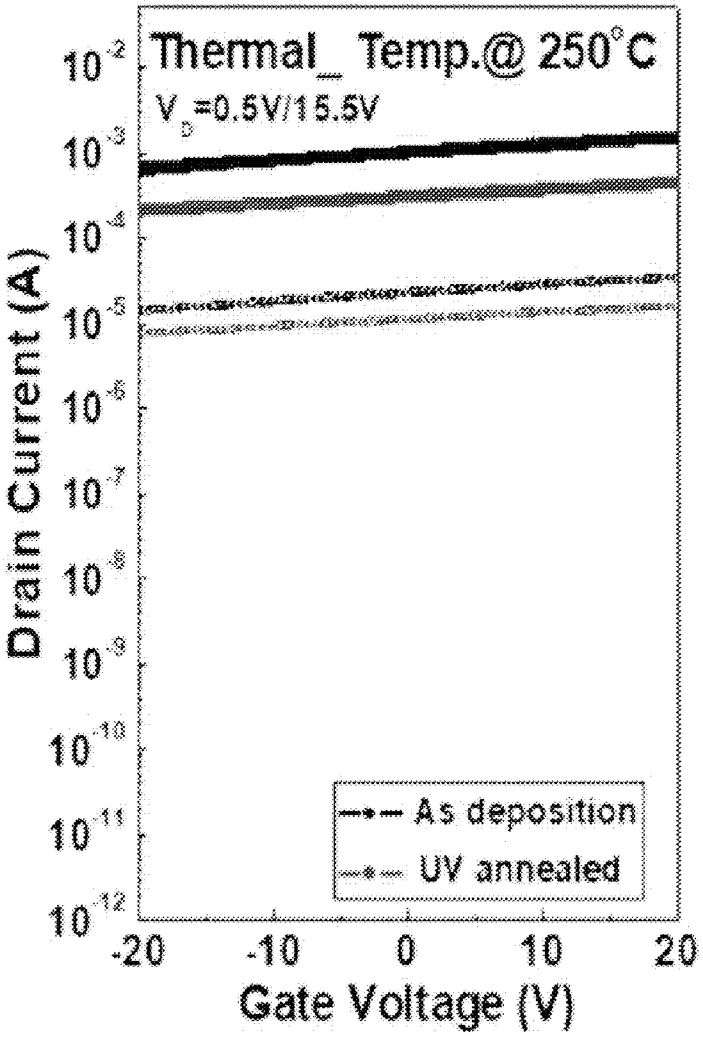

FIG. 22 is a graph showing a structure of the semiconductor thin film according to Example 2 of the present disclosure.

Referring to FIG. 22, crystal structures of the semiconductor thin films according to Examples 2-1 (100° C.), 2-2 (150° C.), 2-3 (200° C.) and 2-4 (250° C.) were measured and shown. As identified in FIG. 22, it was identified that all the semiconductor thin films according to Examples 2-1 to 2-4 showed a cubic structure, a general structure of $In_2O_3$.

In addition, O/In ratio and impurity of the semiconductor thin films according to Examples 2-1 to 2-4 were measured, and the results are summarized in the following Table 12.

TABLE 12

| Entry | O/In Ratio | Impurity | |
|---|---|---|---|
| Example 2-1 (100° C.) | 1.56 | C: N/A | N: N/A |
| Example 2-2 (150° C.) | 1.50 | C: N/A | N: N/A |
| Example 2-3 (200° C.) | 1.50 | C: N/A | N: N/A |
| Example 2-4 (250° C.) | 1.47 | C: N/A | N: N/A |

As identified in Table 12, it was identified that, in the semiconductor thin films according to Examples 2-1 to 2-4, there were no carbon and nitrogen impurities, and the In/O ratio showed an ideal value of 1:2. FIGS. 23 to 26 are graphs showing electrical properties of the transistor according to Example 2 of the present disclosure.

Referring to FIGS. 23 to 26, the gate voltage (V)-dependent drain current (A) of each of the transistors according to Examples 2-1 to 2-4 of the present disclosure was measured and shown. As identified in FIGS. 23 and 26, it was identified that the transistor including the semiconductor thin film deposited at the temperature of 100° C. had insulator properties, and the transistor including the semiconductor thin film deposited at the temperature of 250° C. had conducting properties. On the other hand, as identified in FIGS. 24 and 25, it was identified that, in the transistors including the semiconductor thin films deposited at the temperatures of 150° C. and 200° C., the semiconductor thin films showed semiconductor properties as the semiconductor thin films were UV heat treated.

As a result, it was seen that, when manufacturing the $In_2O_3$ semiconductor thin film using the In precursor providing-purging-$O_2$/Ar (50:50 wt %) plasma providing-purging process, it was effective to control the deposition temperature of the semiconductor thin film to higher than 100° C. and lower than 250° C. in order to enhance electrical properties of the transistor.

Manufacture of Semiconductor Thin Film According to Example 3

A thin film was manufactured by conducting In precursor providing-purging-$H_2O$ providing-purging on a substrate, and the manufactured thin film was UV annealed for 1 hour at a temperature of 250° C. to manufacture an $In_2O_3$ semiconductor thin film according to Example 3. As the In precursor, a compound represented by the following Chemical Formula 1 was used.

[Chemical Formula 1]

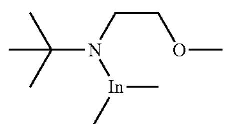

In addition, the process temperature of the In precursor providing-purging-$H_2O$ providing-purging was controlled to 100° C., 150° C., 200° C. and 250° C. to manufacture the semiconductor thin film, and the thin films manufactured at each temperature were defined as semiconductor thin films according to Examples 3-1, 3-2, 3-3 and 3-4, respectively. The process temperatures of the semiconductor thin films according to Examples 3-1, 3-2, 3-3 and 3-4 are summarized in the following Table 11.

TABLE 13

| Entry | ALD Process Temperature |
|---|---|
| Example 3-1 | 100° C. |
| Example 3-2 | 150° C. |
| Example 3-3 | 200° C. |
| Example 3-4 | 250° C. |

Manufacture of Transistor According to Example 3

After forming a $SiO_2$ gate insulating film (100 nm thickness) on a Si gate, each of the semiconductor thin films (20 nm thickness) according to Examples 3-1 to 3-4, an ITO source electrode (100 nm thickness) and an ITO drain electrode (100 nm thickness) were formed on the gate insulating film to manufacture each of transistors according to Examples 3-1 to 3-4.

Figure 27:
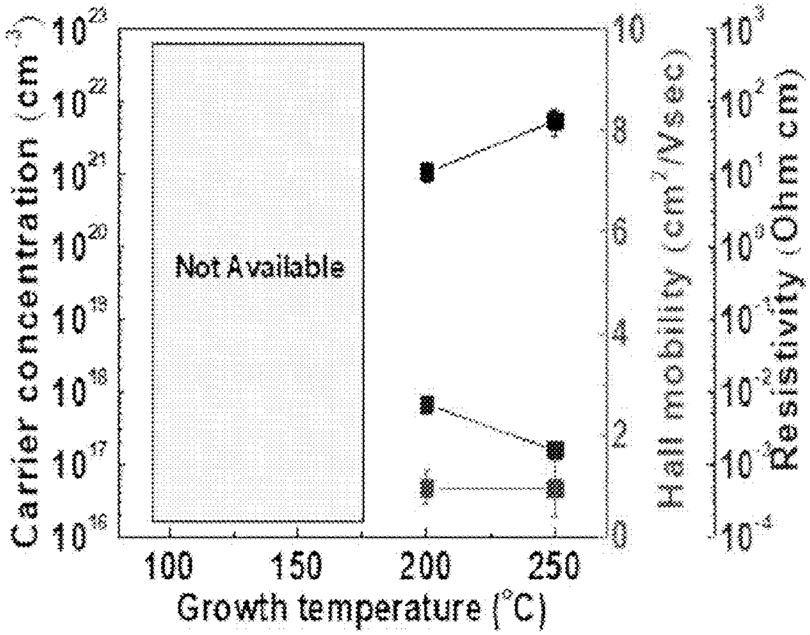
FIG. 27 is a graph showing electrical properties of a semiconductor thin film according to Example 3 of the present disclosure.

FIG. 27 is a graph showing electrical properties of the semiconductor thin film according to Example 3 of the present disclosure.

Referring to FIG. 27, carrier concentration ($cm^{-3}$), hall mobility ($cm^2$/Vsec) and resistivity (Ohm cm) were measured and shown for each of the semiconductor thin films according to Examples 3-1 (100° C.), 3-2 (150° C.), 3-3 (200° C.) and 3-4 (250° C.).

As identified in FIG. 27, it was identified that, in the semiconductor thin film according to Example 3, carrier concentration increased, resistivity decreased and hall mobility was maintained constant as the process temperature of the semiconductor thin film increased.

Figure 28:
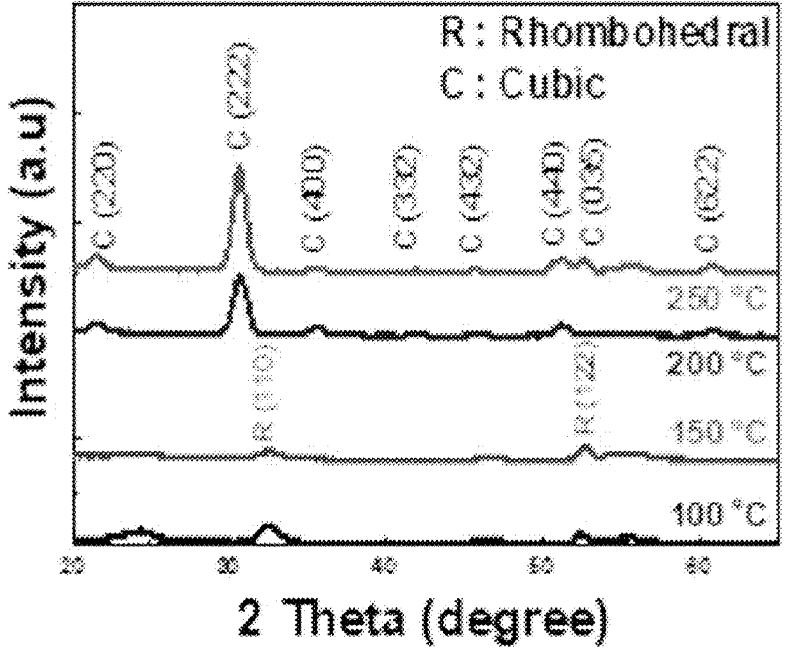
FIG. 28 is a graph showing a structure of the semiconductor thin film according to Example 3 of the present disclosure.
Figure 29:
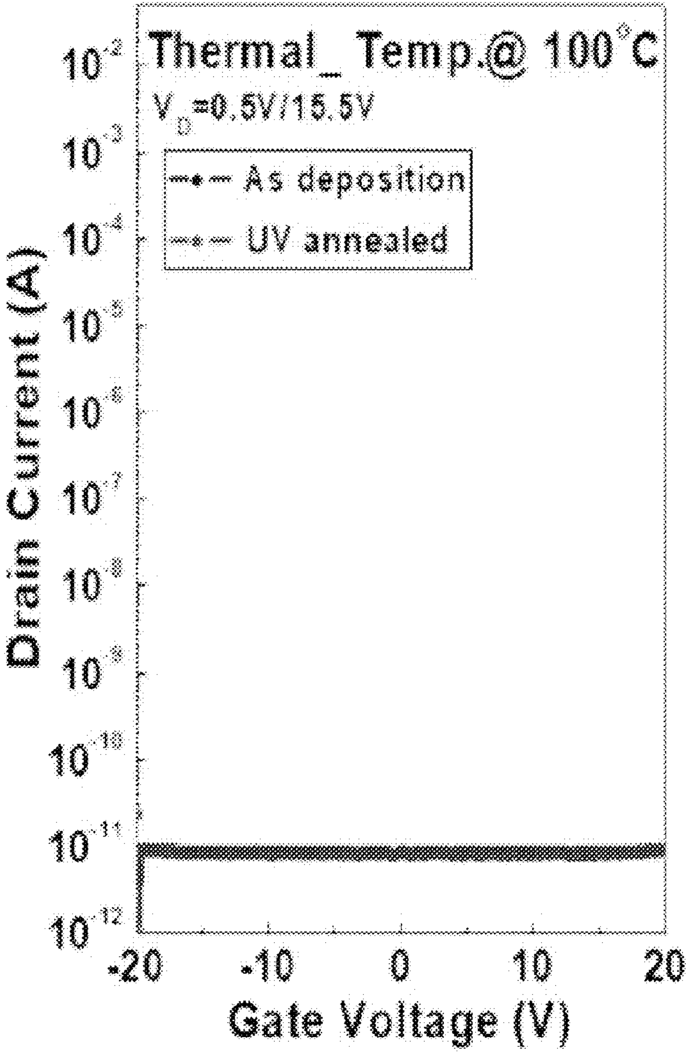
FIGS. 29 to 32 are graphs showing electrical properties of a transistor according to Example 3 of the present disclosure.
Figure 30:
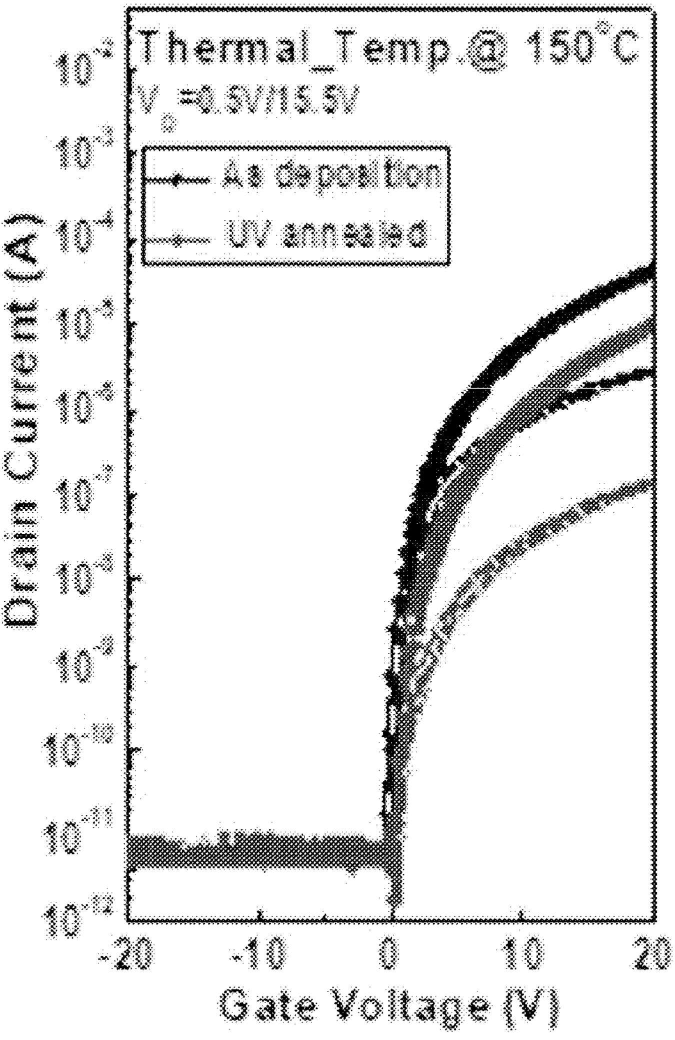
Figure 31:
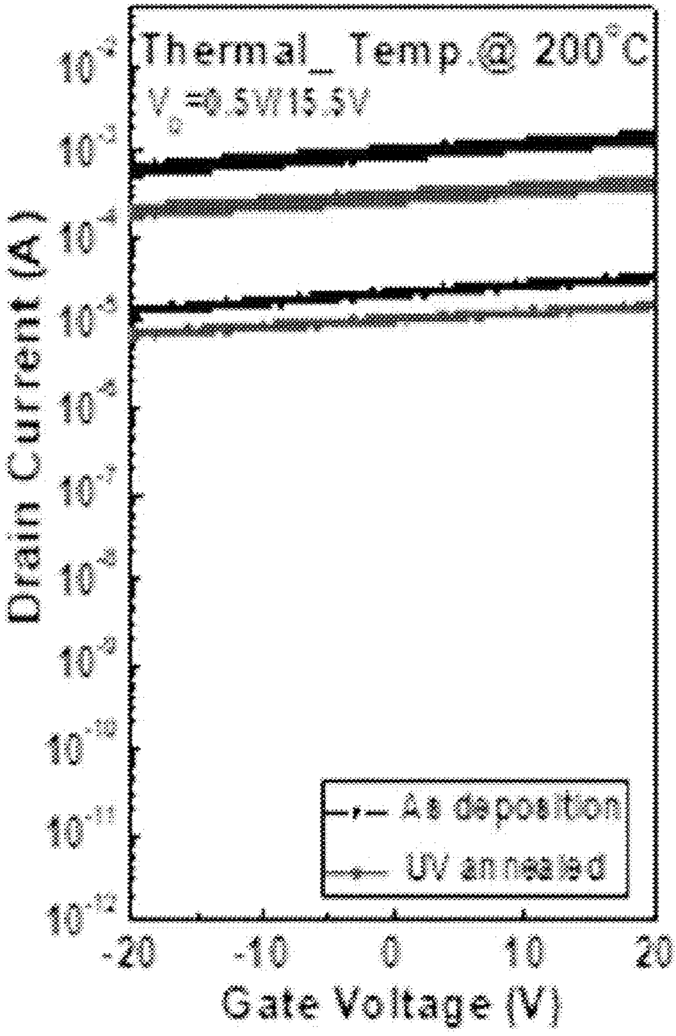
Figure 32:
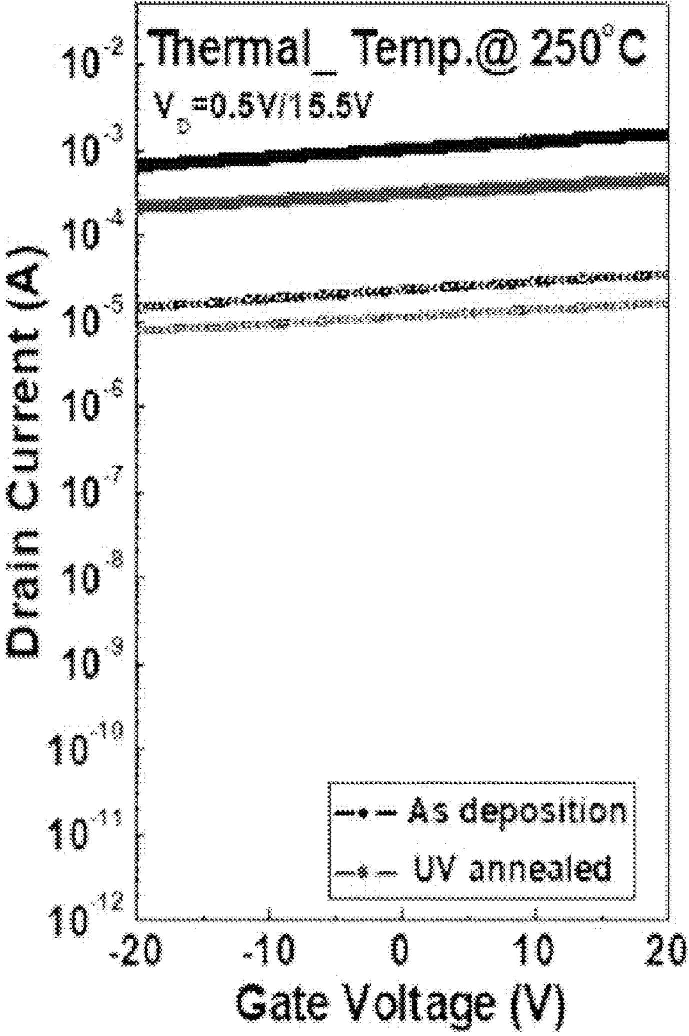

FIG. 28 is a graph showing a structure of the semiconductor thin film according to Example 3 of the present disclosure.

Referring to FIG. 28, crystal structures of the semiconductor thin films according to Examples 3-1 (100° C.), 3-2 (150° C.), 3-3 (200° C.) and 3-4 (250° C.) were measured and shown. As identified in FIG. 28, it was identified that the semiconductor thin films according to Examples 3-1 (100° C.) and 3-2 (150° C.) showed a cubic structure, a general structure of $In_2O_3$, and the semiconductor thin films according to Examples 3-3 (200° C.) and 3-4 (250° C.) showed a rhombohedral structure.

In addition, O/In ratio and impurity of the semiconductor thin films according to Examples 3-1 to 3-4 were measured, and the results are summarized in the following Table 14.

TABLE 14

| Entry | O/In Ratio | Impurity |
|---|---|---|
| Example 3-1 (100° C.) | 1.27 | C: 14.62 |
| Example 3-2 (150° C.) | 1.29 | C: 1.51 |
| Example 3-3 (200° C.) | 1.60 | C: 1.24 |
| Example 3-4 (250° C.) | 1.62 | C: 1.43 |

As identified in Table 14, it was identified that, in the semiconductor thin films according to Examples 3-1 to 3-4, the O/In ratio was approximately 1.3 at 100° C. and 150° C. and approximately 1.6 at 200° C. and 250° C., which is the same tendency as the crystal structure, and approximately 14% of carbon impurities were included at 100° C. FIGS. 29 to 32 are graphs showing electrical properties of the transistor according to Example 3 of the present disclosure.

Referring to FIGS. 29 to 32, the gate voltage (V)-dependent drain current (A) of each of the transistors according to Examples 3-1 to 3-4 of the present disclosure was measured and shown. As identified in FIG. 29, it was identified that the transistor including the semiconductor thin film deposited at the temperature of 100° C. had insulator properties, and as identified in FIGS. 31 and 32, it was identified that the transistors including the semiconductor thin films deposited at the temperatures of 200° C. and 250° C. had conducting properties. On the other hand, as identified in FIG. 30, it was identified that, in the transistor including the semiconductor thin film deposited at the temperature of 150° C., the semiconductor thin film showed semiconductor properties as the semiconductor thin film was UV heat treated.

As a result, it was seen that, when manufacturing the $In_2O_3$ semiconductor thin film using the In precursor providing-purging-$H_2O$ providing-purging process, it was effective to control the deposition temperature of the semiconductor thin film to higher than 100° C. and lower than 200° C. in order to enhance electrical properties of the transistor.

Hereinbefore, the present disclosure has been described in detail using preferred examples, however, the scope of the present disclosure is not limited to specific examples, and needs to be construed by the attached claims. In addition, it needs to be understood that various modifications and changes may be made by those skilled in the art without departing from the scope of the present disclosure.

INDUSTRIAL APPLICABILITY

The method for manufacturing a semiconductor layer according to the present disclosure includes preparing a substrate, and conducting a first unit process of reacting a first precursor including indium (In) and a first reaction source and a second unit process of reacting a second precursor including gallium (Ga) and a second reaction source to form a semiconductor layer including the indium and the gallium on the substrate, wherein the first precursor and the second precursor may include the same ligand. Accordingly, the composition ratio is readily controlled in the semiconductor layer, and therefore, a transistor including the semiconductor layer may have enhanced electrical properties and reliability.

The invention claimed is:

1. A method for manufacturing a semiconductor layer, the method comprising:

preparing a substrate; and conducting a first unit process of reacting a first precursor including indium (In) and a first reaction source and a second unit process of reacting a second precursor including gallium (Ga) and a second reaction source to form a semiconductor layer including the indium and the gallium on the substrate, wherein the first precursor and the second precursor have a ligand with the same chemical structure, wherein the first precursor includes a compound represented by the following Chemical Formula 1, and the second precursor includes a compound represented by the following Chemical Formula 2:

[Chemical Formula 1]

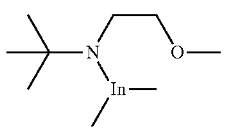

-continued

[Chemical Formula 2]

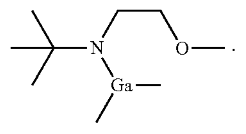

2. The method of claim 1, further comprising:

after the forming of a semiconductor layer, heat treating the semiconductor layer, wherein a temperature of the heat treatment of the semiconductor layer is controlled depending on the number of repetitions of the first unit process and the number of repetitions of the second unit process.

3. The method of claim 2, wherein, when the number of repetitions of the first unit process:the number of repetitions of the second unit process is 4:1, the semiconductor layer is heat treated at higher than 350° C. and lower than 450° C.

4. The method of claim 2, wherein, when the number of repetitions of the first unit process:the number of repetitions of the second unit process is 6:1, the semiconductor layer is heat treated at higher than 300° C. and lower than 400° C.

5. The method of claim 2, wherein the semiconductor layer is heat treated by ultraviolet (UV) rays.

6. The method of claim 1, wherein the first reaction source and the second reaction source include a plasma in which oxygen ($O_2$) and argon (Ar) are mixed.

7. A transistor comprising:

a substrate;

a gate insulating film disposed on the substrate;

an active layer disposed on the gate insulating film and including indium (In) and gallium (Ga); and a source electrode disposed on the gate insulating film so as to be in contact with one side of the active layer and a drain electrode disposed on the gate insulating film so as to be in contact with the other side of the active layer, wherein, in the active layer, a content of the indium is greater than 25.3 wt % and less than 33.5 wt % and a content of the gallium is greater than 6.8 wt % and less than 16.9 wt %, wherein an on/off ratio ($I_{ON}/I_{OFF}$) is 6.2E+10 or greater.

8. The transistor of claim 7, wherein the active layer has mobility of 26.0 $cm^2/Vs$ or greater.

9. A method for manufacturing a semiconductor layer, the method comprising:

preparing a substrate;

providing a precursor including indium on the substrate;

providing a reaction source on the precursor-provided substrate to form a semiconductor layer, in which the precursor and the reaction source are reacted, at a first temperature; and heat treating the semiconductor layer at a second temperature, wherein the first temperature is controlled depending on a type of the reaction source, wherein the precursor includes a compound represented by the following Chemical Formula 1:

[Chemical Formula 1]

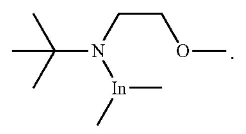

10. The method of claim 9, wherein the reaction source includes a plasma in which oxygen ($O_2$) and argon (Ar) are mixed, and the first temperature is controlled to higher than 100° C. and lower than 250° C.

11. The method of claim 9, wherein the reaction source includes water ($H_2O$), and the first temperature is controlled to higher than 100° C. and lower than 200° C.

* * * * *